(12) United States Patent
Ikata et al.

(10) Patent No.: US 6,501,344 B2
(45) Date of Patent: Dec. 31, 2002

(54) DUPLEXER DEVICE

(75) Inventors: Osamu Ikata, Kawasaki (JP); Yoshio Satoh, Kawasaki (JP); Nobuo Hirasawa, Kawasaki (JP); Hidenori Fukushima, Kawasaki (JP)

(73) Assignees: Fujitsu Limited, Kawasaki (JP); Fujitsu Media Devices Limited, Suzaka (JP)

( * ) Notice: Subject to any disclaimer, the term of this patent is extended or adjusted under 35 U.S.C. 154(b) by 0 days.

(21) Appl. No.: 09/793,127

(22) Filed: Feb. 27, 2001

(65) Prior Publication Data

US 2001/0040487 A1 Nov. 15, 2001

(30) Foreign Application Priority Data

May 10, 2000 (JP) ........................................ 2000-137191

(51) Int. Cl.[7] ................................................ H03H 9/72
(52) U.S. Cl. ...................................... 333/133; 333/193
(58) Field of Search ................................ 333/133, 193, 333/126, 134, 132, 127, 128

(56) References Cited

U.S. PATENT DOCUMENTS 5,561,406 A * 10/1996 Ikata et al. .................. 333/126
5,786,738 A * 7/1998 Ikata et al. .................. 333/133
5,859,473 A * 1/1999 Ikata et al. .................. 257/723

FOREIGN PATENT DOCUMENTS

JP 10-126213 5/1998

* cited by examiner

Primary Examiner—Robert Pascal
Assistant Examiner—Dean Takaoka
(74) Attorney, Agent, or Firm—Armstrong, Westerman & Hattori, LLP

(57) ABSTRACT

A duplexer device of this invention includes two surface acoustic wave filters having different band center frequencies and a phase matching circuit for matching phases of the two surface acoustic wave filters. The phase matching circuit is composed of one or more. line patterns, and at least one of the line patterns is formed as divided among a plurality of internal layers of a multi-layer package, and at least the line patterns formed on the internal layers adjacent to each other have pattern shapes different from each other. According to the invention, a duplexer device having a small size and stable filter characteristics can be provided.

8 Claims, 20 Drawing Sheets

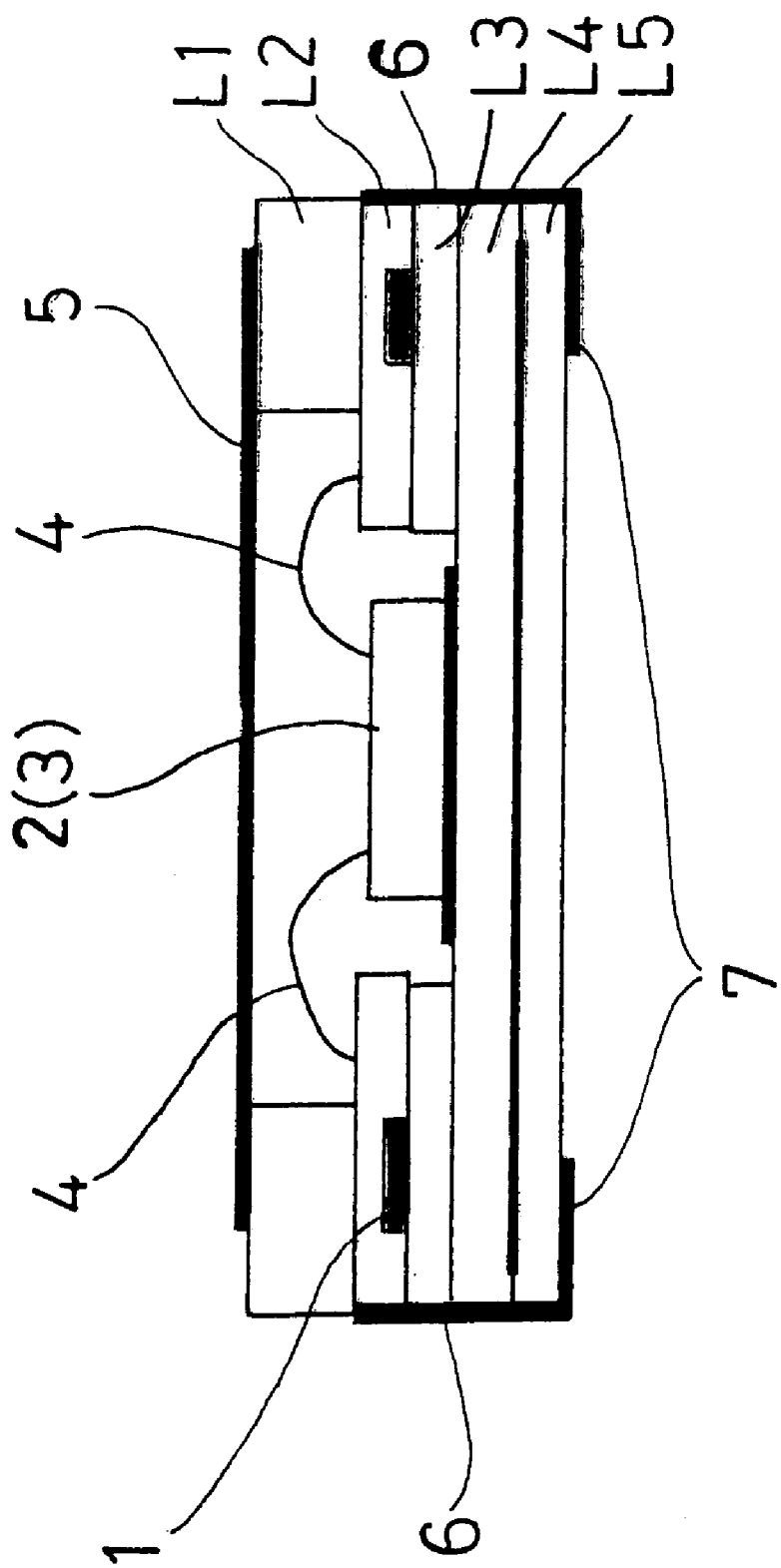

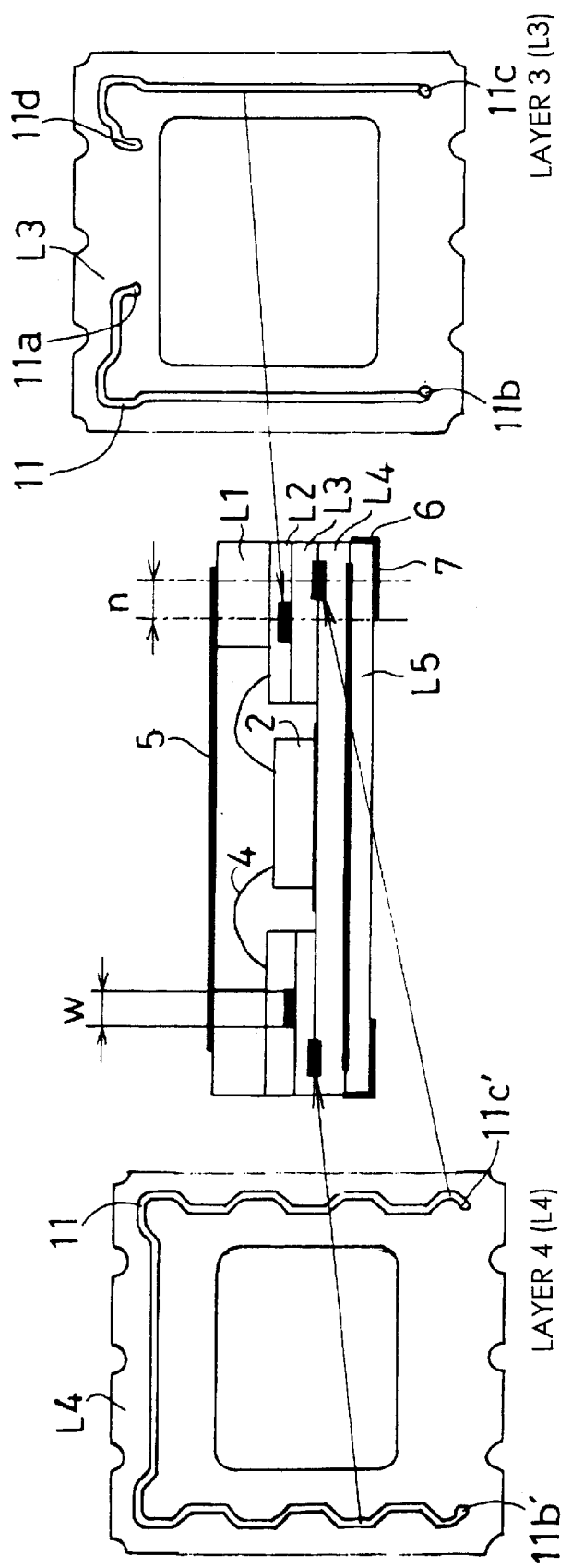

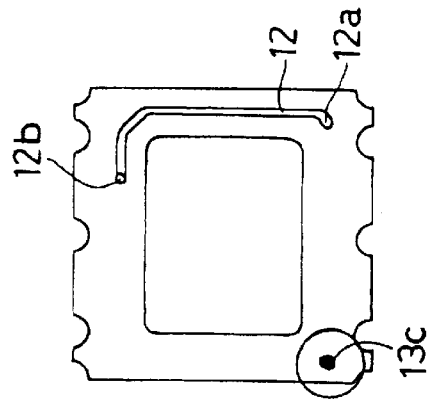
FIG. 8(c) LAYER 3 (L3)
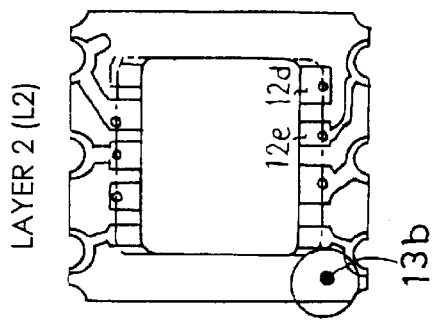
FIG. 8(f) LAYER 5 (L5) BACK SURFACE
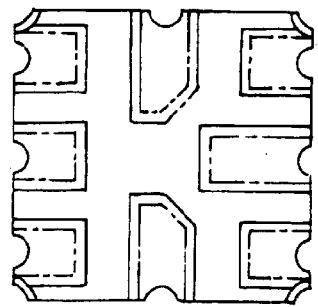
FIG. 8(b) LAYER 2 (L2)
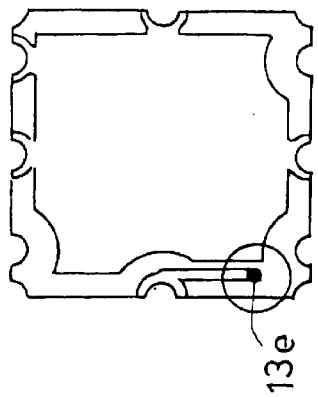
FIG. 8(e) LAYER 5 (L5) SURFACE
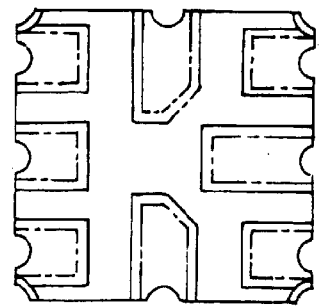
FIG. 8(a) LAYER 1 (L1)
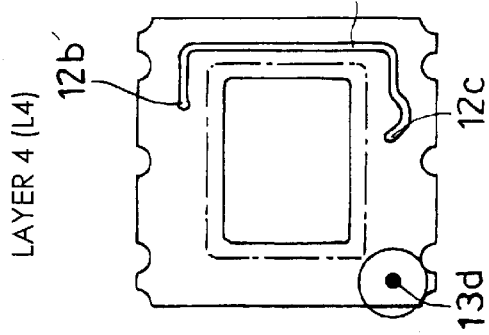
FIG. 8(d) LAYER 4 (L4)
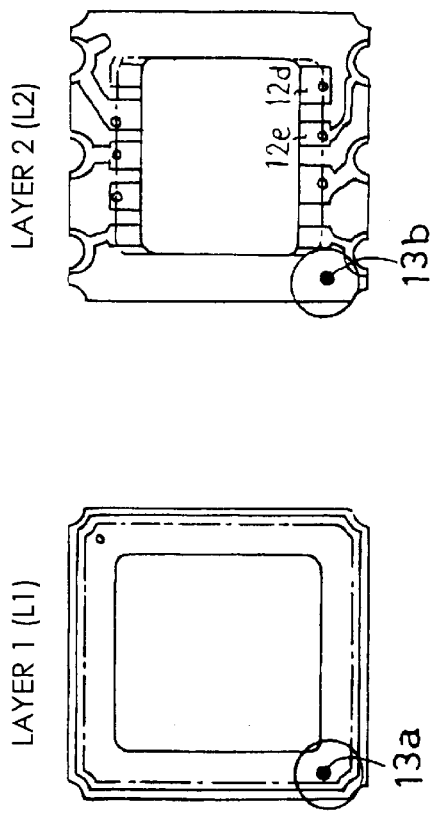

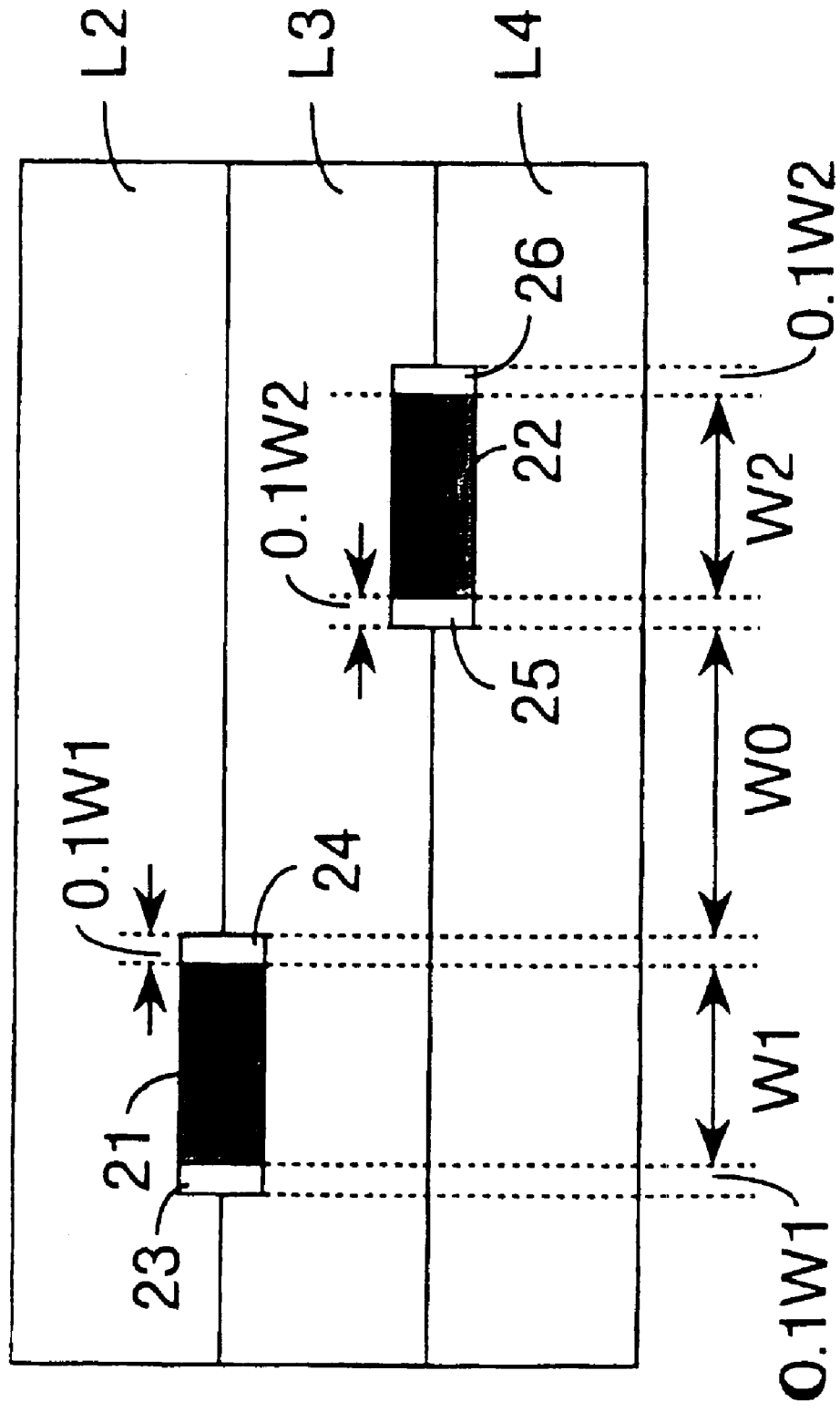

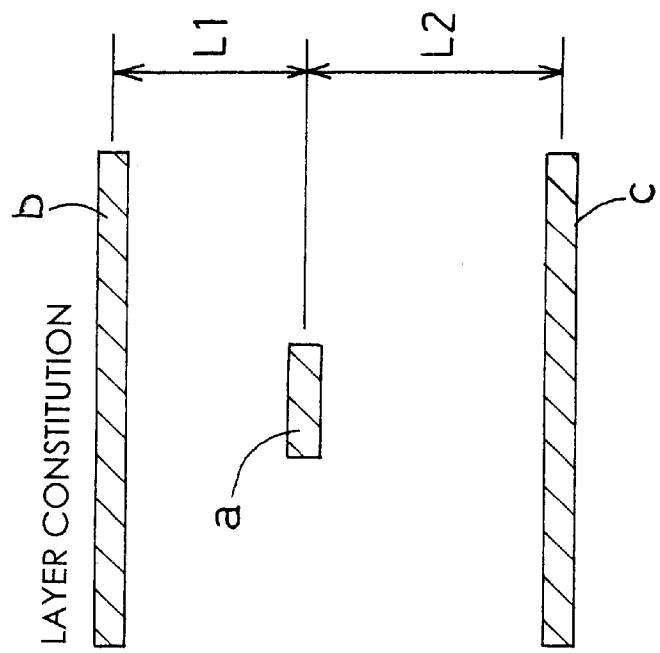
FIG. 11 (b) (Prior Art)
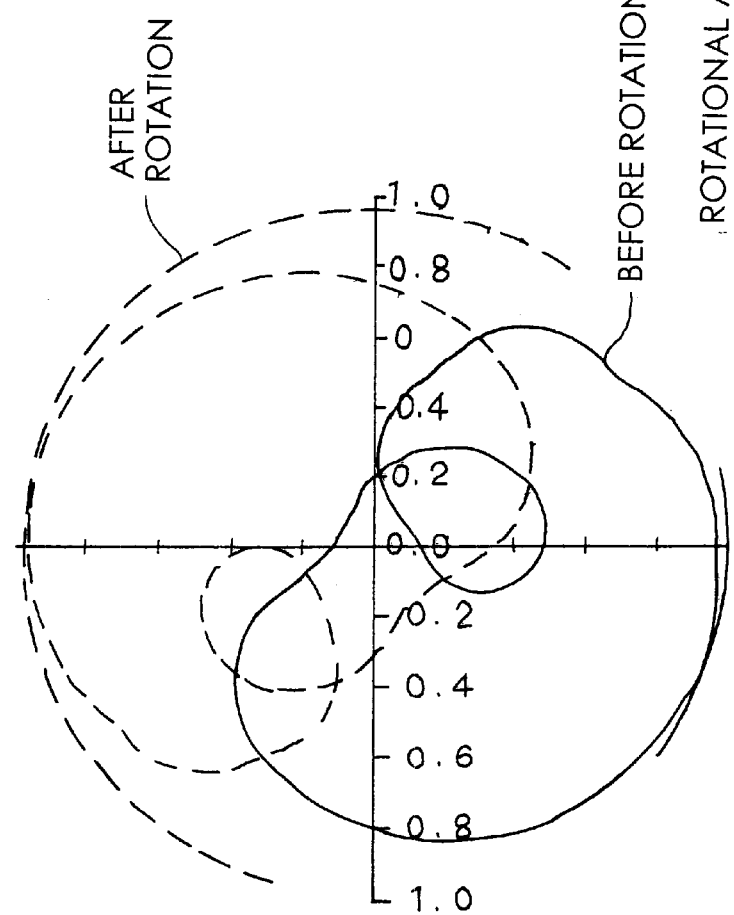
FIG. 11 (a) (Prior Art)

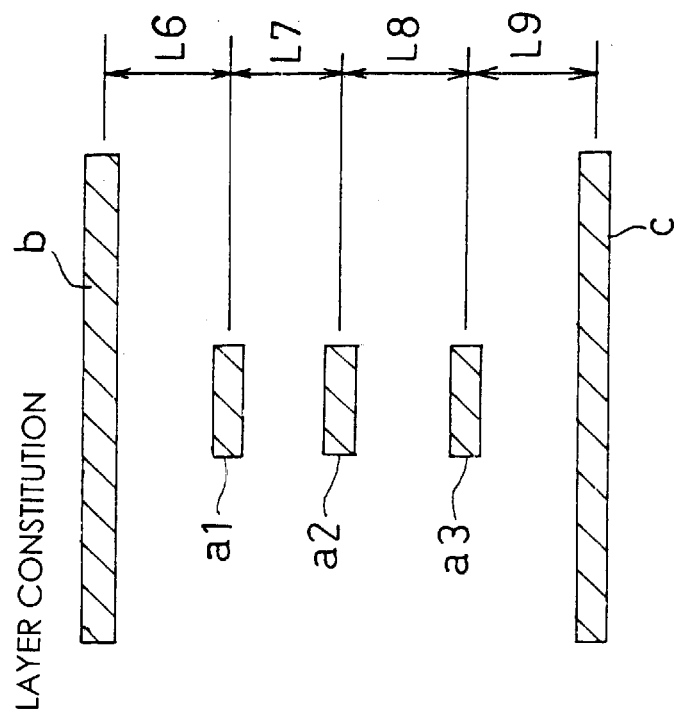
FIG. 13 (b) (Prior Art)
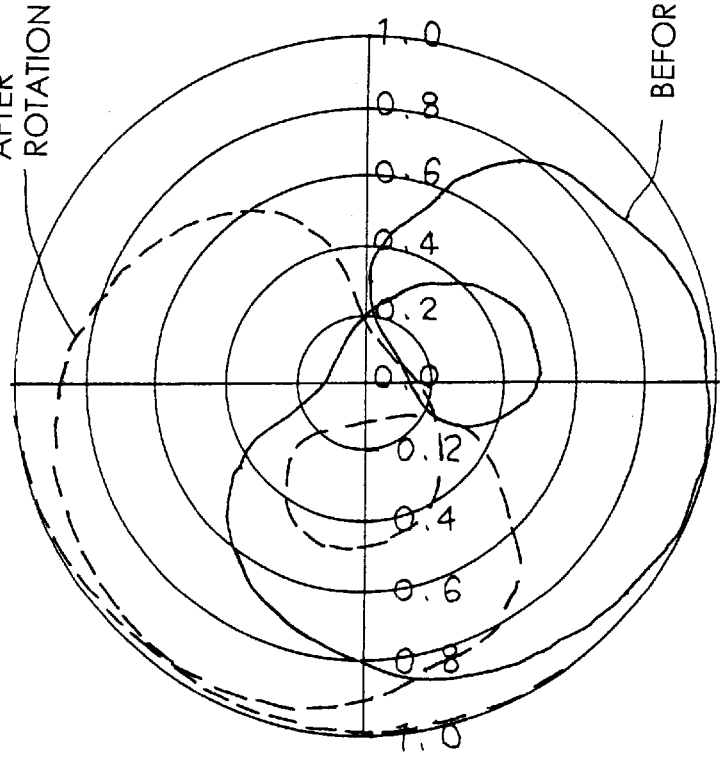
FIG. 13 (a) (Prior Art)

LAYER CONSTITUTION

PATTERN FORMED OVER THREE LAYERS (559.000MHz to 1.159GHz)    ROTATIONAL AMOUNT: 120.64°

ROTATIONAL AMOUNT BY MATCHING CIRCUIT

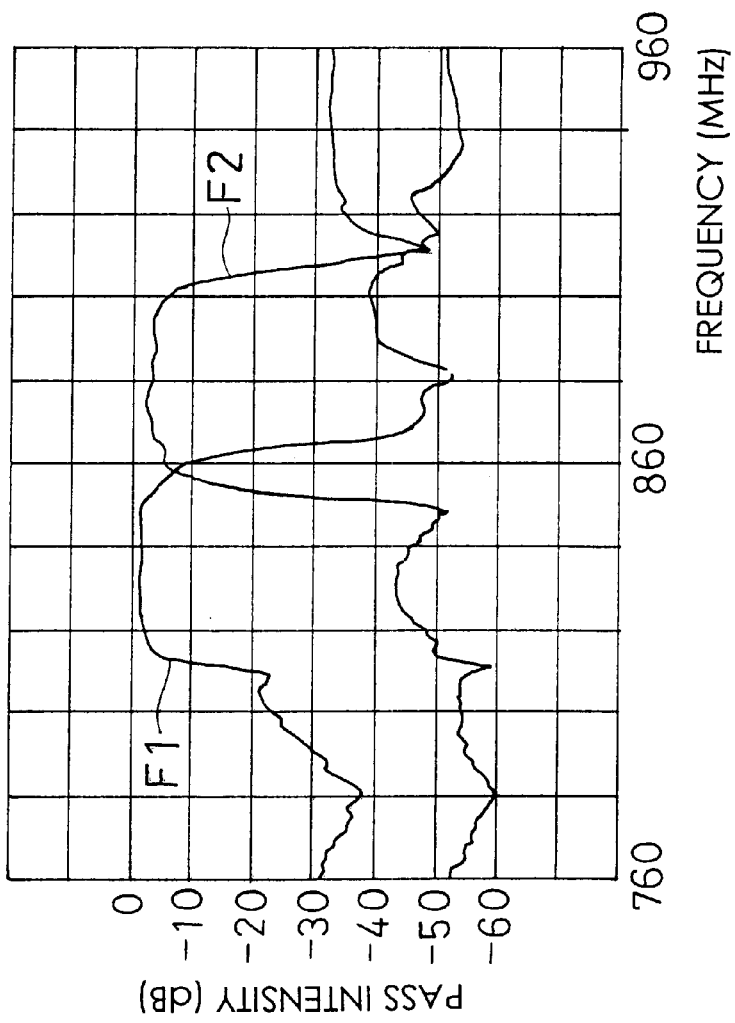
FIG. 19 (b) (Prior Art)
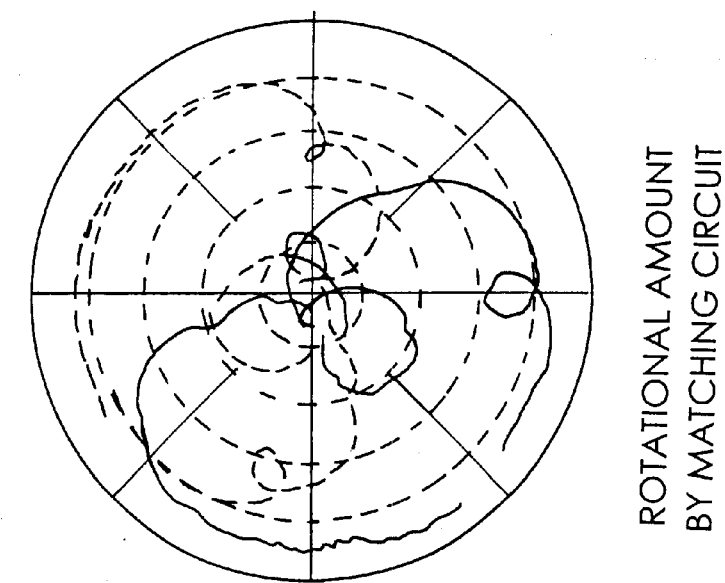
FIG. 19 (a) (Prior Art)

DUPLEXER DEVICE

CROSS-REFERENCE TO RELATED APPLICATION

This application is related to Japanese Patent Application No. 2000-137191 filed on May 10, 2000, whose priority is claimed under 35 USC § 119, the disclosure of which is incorporated by reference in its entirety.

BACKGROUND OF THE INVENTION

1. Field of the Invention

The present invention relates to a duplexer device, and particularly, it relates to a duplexer device using a surface acoustic wave filter.

2. Description of the Related Art

In recent years, in connection with the development of mobile communication systems, a portable phone and a portable information terminal have been quickly spread and have been demanded to have a small size and high performance.

The frequency bands used include various ranges, such as an 800 MHz to 1 GHz band and a 1.5 GHz to 2.0 GHz band.

In the development of portable phones in recent years, terminals are made to have high performance by having dual mode (such as a combination of an analog mode and a digital mode, and a combination of two digital modes, TDMA (time division multiple access) and CDMA (code division multiple access)) and dual band (a combination of a 800 MHz band and a 1.9 GHz band, and a combination of 900 MHz band and a 1.8 GHz band or a 1.5 GHz band).

Under the circumstances, parts used in the portable phone (such as a filter) are also demanded to have high performance. Furthermore, miniaturization and a low production cost are also assumedly demanded in addition to the high performance.

In the mobile communication equipments, an antenna duplexer is used as a component of an RF (radio frequency) part conducting branching and generation of signals transmitted and received by an antenna.

FIG. 20 shows a constitutional block diagram of a radio frequency part of a portable phone that has been conventionally used.

An audio signal 100 input from a microphone is transformed into a modulation signal of the modulation mode of the portable phone system by a modulator 101, and after further transformed into a prescribed carrier frequency by a local oscillator 108, it passes through an inter-stage filter 102 selecting only a signal of the prescribed transmission frequency and amplified to a desired signal intensity by a power amplifier 103 to feed in an antenna duplexer 105. The antenna duplexer 105 feeds only a signal of the prescribed transmission frequency to an antenna 104, which is then transmitted to the air as a radio signal from the antenna 104.

On the other hand, a signal received by the antenna 104 is fed to the antenna duplexer 105, and only a signal of a prescribed frequency is selected. The selected reception signal is amplified by a low noise amplifier 106, and after passing through an inter-stage filter 107, only a message signal is selected by an IF filter and taken out as an audio signal 100 by a demodulator 111. The antenna duplexer 105 is positioned between the antenna 104 and the so-called audio signal processing circuit and distributes the transmission signal and the reception signal to prevent interference of them.

An antenna duplexer requires at least a transmission filter and a reception filter and also has a matching circuit (which is also referred to as a phase matching circuit or a line pattern for phase matching) for preventing interference of the transmission signal and the reception signal.

An antenna duplexer of the high performance terminal includes a duplexer using a dielectric material, a composite duplexer using a surface acoustic wave filter with a dielectric material in at least one filter, and a duplexer using only a surface acoustic wave filter. The duplexer using a dielectric material has a large size, and thus it is difficult to produce a portable terminal equipment of a compact size and a small thickness.

In the case of an antenna duplexer using a surface acoustic wave filter in one filter, it is difficult to achieve a compact size and a small thickness due to the size of the dielectric material device.

The conventional duplexer device using a surface acoustic wave filter includes a modular type having a filter and a matching circuit separately carried on a printed circuit board and a one-piece type having transmission, and reception filter chips in a multi-layer ceramic package and a matching circuit inside the duplexer package.

The duplexer device of this type has a compact size and a small thickness, i.e., from $1/5$ to $1/15$ in volume and from $1/2$ to $1/3$ in height of the conventional duplexer using a dielectric material. It is possible to realize the equivalent cost to the dielectric material device by using the surface acoustic wave device and by reducing the device size.

A further demand is expected to reduce the size of the duplexer, and it is necessary therefor to use a structure using a multi-layer ceramic package disclosed in Japanese Unexamined Publication No. Hei 10(1998)-126213, to provide two filters on one chip to apply a flip chip mounting technique using no wire connection. In either case, a "duplexer package" is capable of airtightly sealing two surface accostic wave filters and a "matching circuit" to constitute a duplexer with the two filters.

That is, in order to realize a duplexer device of a compact size and a low cost, it is demand ed to mass-produce duplexer packages having stable characteristics. In order to mass-produce duplexer packages, such a process has been used that package devices are arranged on a ceramic multi-layer sheet in a matrix form, which is divided into respective chips in the final stage after baking. The process is recently improved so that, instead of a sheet (shown in FIG. 4) having the waste part among the respective devices, it is used a sheet of a fine matrix arrangement (shown in FIG. 5) having devices directly arranged, whereby the number of produced devices is improved. In FIGS. 4 and 5, the respective squares indicate duplexer devices. The multi-layer sheet is formed by stacking, for example, five ceramic sheets. The duplexer package is produced mainly by the stacking step and the baking step subsequently conducted.

What is brought question is accuracy influenced by deviation of layer accumulation caused upon making a multi-layer structure of plural ceramic sheets.

FIG. 6 shows a cross sectional structure of a conventional duplexer.

The conventional duplexer shown in FIG. 6 has a five-layer structure of from a layer 1 (L1) to a layer 5 (L5), and a lid 5 is arranged on the layer 1 (L1) as the uppermost layer. Filter chips 2 and 3 are mounted on a surface of the layer 4 (L4), and connection terminals on the filter chip and bonding terminals on the layer (L2) are connected with wires 4.

Connection terminals to an outside circuit are arranged on a back surface of the layer 5 (L5).

A line pattern 1 of a phase matching circuit is formed on a surface of the layer 3 (L3) as an internal layer. Furthermore, a side castellation 6 as a connection path to the connection terminal of the layer 5 (L5) is formed from the layer 2 (L2) having the bonding terminals to the back surface of the layer 5 (L5) as the lowermost layer.

Along with reduction in size of a duplexer package, the thickness in the width direction on the side surface of the package is also decreased, and thus such a problem (short circuit problem) occurs in that a pattern formed in the internal layer (for example, the line pattern 1 for phase matching) is in contact with a pattern of the connection part 6 (side castellation) formed on the side surface of the package caused by deviation upon stack of the layers.

When the number of layers, on which the side castellation 6 is formed, is decreased to prevent the contact, the positional accuracy becomes more severe. In the case where the line pattern for phase matching is formed over the plural layers to overlap the upper and lower line patterns, other problems occur in that the characteristics are different from the designed value, and stable characteristics cannot be obtained.

FIGS. 11 to 13 are diagrams for showing simulation results of the phase rotational amount of the line pattern of the conventional phase matching circuit.

FIG. 11 shows the case where a line pattern a is formed in one layer, which has such a structure that the line pattern a is sandwiched by GND patterns (b and c) formed in the upper layer and the lower layer.

Herein, a distance L1 is 0.5 mm, L2 is 0.6 mm, a dielectric constant $\in r$ is 9.5, a line width W1 of the line pattern is 0.1 mm, and a line length L0 thereof is 24 mm.

FIG. 12 shows the case where one matching circuit is formed as dividing as line patterns a1 and a2 in separate two layers, which has such a structure that the line patterns a1 and a2 are arranged at positions overlapping each other in the vertical direction, i.e., the overlapping direction of the layers, and are sandwiched by GND patterns b and c.

Herein, a distance L3 is 0.5 mm, L4 is 0.3 mm, and L5 is 0.3 mm, and the line width W1 and the line length L0 are the same as in FIG. 11.

FIG. 13 shows the case where one matching circuit is formed as dividing as line patterns a1, a2 and a3 in separate three layers, which has such a structure that the line patterns a1, a2 and a3 are arranged at positions overlapping each other in the direction perpendicular to the paper surface, and are sandwiched by GND patterns b and c. Herein, a distance L6 is 0.3 mm, L7 is 0.2 mm, L8 is 0.3 mm, and L9 is 0.3 mm, and the line width W1 and the line length L0 are the same as in FIG. 11.

It is understood that the phase rotational amount is about 188° in the pattern formed in one layer, whereas the rotational amount is decreased to 132° and 105° when the patterns of the same length are formed by folding as two or three layers as shown in FIGS. 12 and 13. The decrease in rotational amount means deterioration of the matching property among the frequency characteristics of the filter.

Because an antenna duplexer device is used in frequency bands of several hundreds MHz to several GHz, desired frequency characteristics are realized by providing a large number of connection terminals as possible on the duplexer package, and therefore the connection terminals are often formed on peripheries of all the edges of the package. That is, slight deviation in layer accumulation of the multi-layer sheet causes a short circuit problem.

When the patterns form a short circuit, the circuit of the duplexer cannot be constituted, and the desired filter characteristics of the duplexer device cannot be obtained to produce a defective product. Furthermore, in the case where the line patterns of the matching circuit overlap in the upper and lower layers as in FIG. 12, a capacitive coupling is formed between the line patterns a1 and a2, whereby even though the line length is the same, the rotational amount is decreased from the desired designed phase rotational amount, or a leakage signal is formed in the characteristics of the signal terminals. As a result, the frequency characteristics of the two filters constituting the duplexer are deteriorated.

SUMMARY OF THE INVENTION

The invention relates to a duplexer device comprising two surface acoustic wave filters having different band center frequencies and a phase matching circuit for matching phases of the two surface acoustic wave filters, wherein the phase matching circuit is composed of one or more line patterns, and at least one of the line patterns is formed as divided among a plurality of internal layers of a multi-layer package, and at least the line. patterns formed on the internal layers adjacent to each other have pattern shapes different from each other.

According to the constitution, a duplexer device having stable filter characteristics and high performance can be provided with low costs in a smaller size than the conventional one.

BRIEF DESCRIPTION OF THE DRAWINGS

FIG. 6 is a schematic cross sectional view showing a conventional duplexer package FIGS. 7(a) to 7(c) are diagrams showing an example of patterns of layers, in which a matching circuit of the invention is formed.

FIGS. 8(a) to 8(f) are plane views showing constitutional patterns of respective layers in one example of a duplexer package according to the invention.

FIG. 9 is a diagram showing deviation of the line patterns of a phase matching circuit according to the invention.

FIGS. 11(a) and 11(b) are diagrams showing a simulation result of a phase rotational amount of a conventional phase matching circuit.

FIGS. 13(a) and 13(b) are diagrams showing a simulation result of a phase rotational amount of a conventional phase matching circuit.

FIGS. 19(a) and 19(b) are a Smith chart and a graph of device frequency characteristics of the conventional case where a matching circuit is formed over two layers and is arranged to overlap in the layer direction.

DESCRIPTION OF THE PREFERRED EMBODIMENTS

Figure 1:
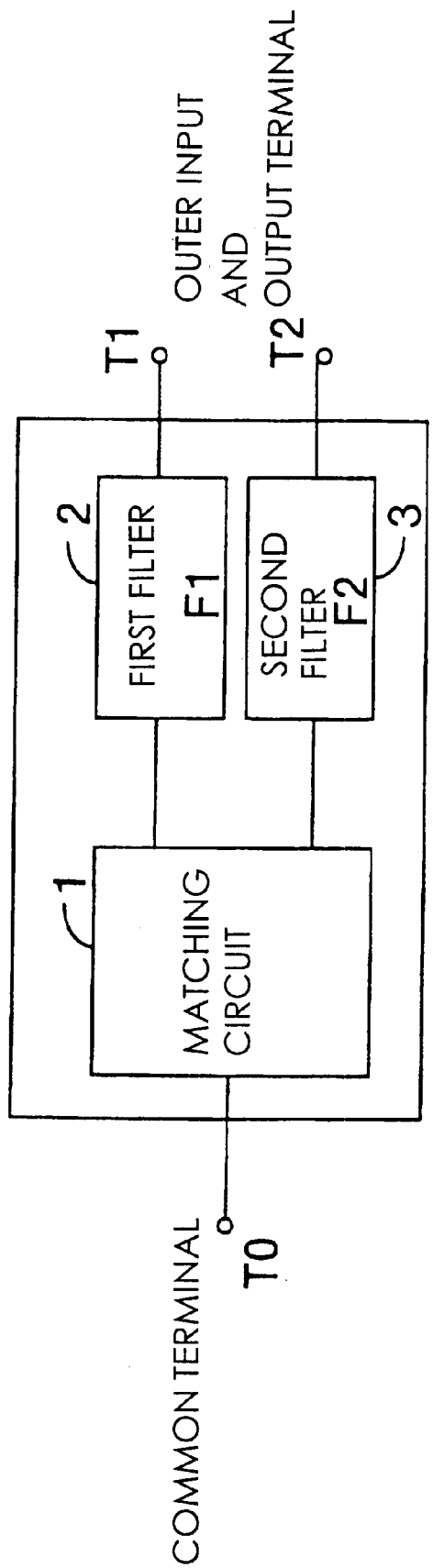
FIG. 1 is a schematic block diagram showing a constitution of a duplexer according to the invention.

The invention provides a duplexer device comprising two surface acoustic wave filters having different band center frequencies and a phase matching circuit for matching phases of the two surface acoustic wave filters. The phase matching circuit comprises one or more line patterns and at least one of the line patterns is formed as divided among a plurality of internal layers of a multi-layer package, and at least the line patterns formed on the internal layers adjacent to each other have pattern shapes different from each other.

It is possible in the invention that the phase matching circuit is formed over two internal layers adjacent to each other, a pattern shape of the phase matching circuit formed on one of the internal layers is of a straight pattern, and a pattern shape of the phase matching circuit formed on the other of the internal layers is of a snake form pattern.

It is also possible in the invention that a symmetric center line of the snake form pattern and a center line in a width direction of the straight pattern are different from each other in an overlapping direction of the layers.

It is also possible in the invention that the phase matching circuit is formed over two internal layers adjacent to each other, both pattern shapes of the phase matching circuits formed on the two layers are of a straight pattern, and positions where the two straight patterns are formed are different from each other in an overlapping direction of the layers.

It is also possible in the invention that the patterns formed over two internal layers adjacent to each other are of a snake form pattern.

It is also possible in the invention that a first circuit pattern formed on the uppermost layer and a second circuit pattern formed on a lowermost layer are connected through a via hole that is not connected to any other circuit patterns.

It is further possible in the invention that the duplexer device comprises a layer having an outer connection terminal as a lowermost layer, and a connection line connected to the outer connection terminal is provided on an outer side surface of layers lower than layers having the phase matching circuit formed therein.

The invention will be further described in detail with reference to preferred embodiments shown in the drawings, but the invention is not construed as being limited thereto.

FIG. 1. is a schematic block diagram showing a duplexer according to the invention.

The duplexer comprises two surface acoustic wave filters 2 (F1) and 3 (F2) and one matching circuit 1, and also has a common terminal T0 connected to an antenna and input and output terminals T1 and T2. A surface acoustic wave filter (hereinafter referred to as a SAW filter) comprising combinations of surface acoustic wave resonators is used as the filters F1 and F2 from the standpoint of the miniaturization and the demanded performance.

The matching circuit 1 is provided between the common terminal T0 and the SAW filters to reduce interference of the two SAW filters and to obtain desired filter characteristics. The matching circuit 1 may be provided between the common terminal T0 and the filter F1 and between the common terminal T0 and the filter F2, respectively, but it is preferred from the standpoint of miniaturization that the matching circuit is provided between the common terminal T0 and either one of the filters. In the following description, it is assumed that the matching circuit is provided between the common terminal T0 and the filter F1.

The matching circuit 1 is generally formed with a material mainly comprising tungsten or copper, and is produced as a long line having a certain length. The matching circuit 1 has a width of about from 0.1 to 0.2 mm and a line length of about several tens mm, and the line length thereof is determined in relationship to the center frequency of the demanded SAW filter.

Figure 2:
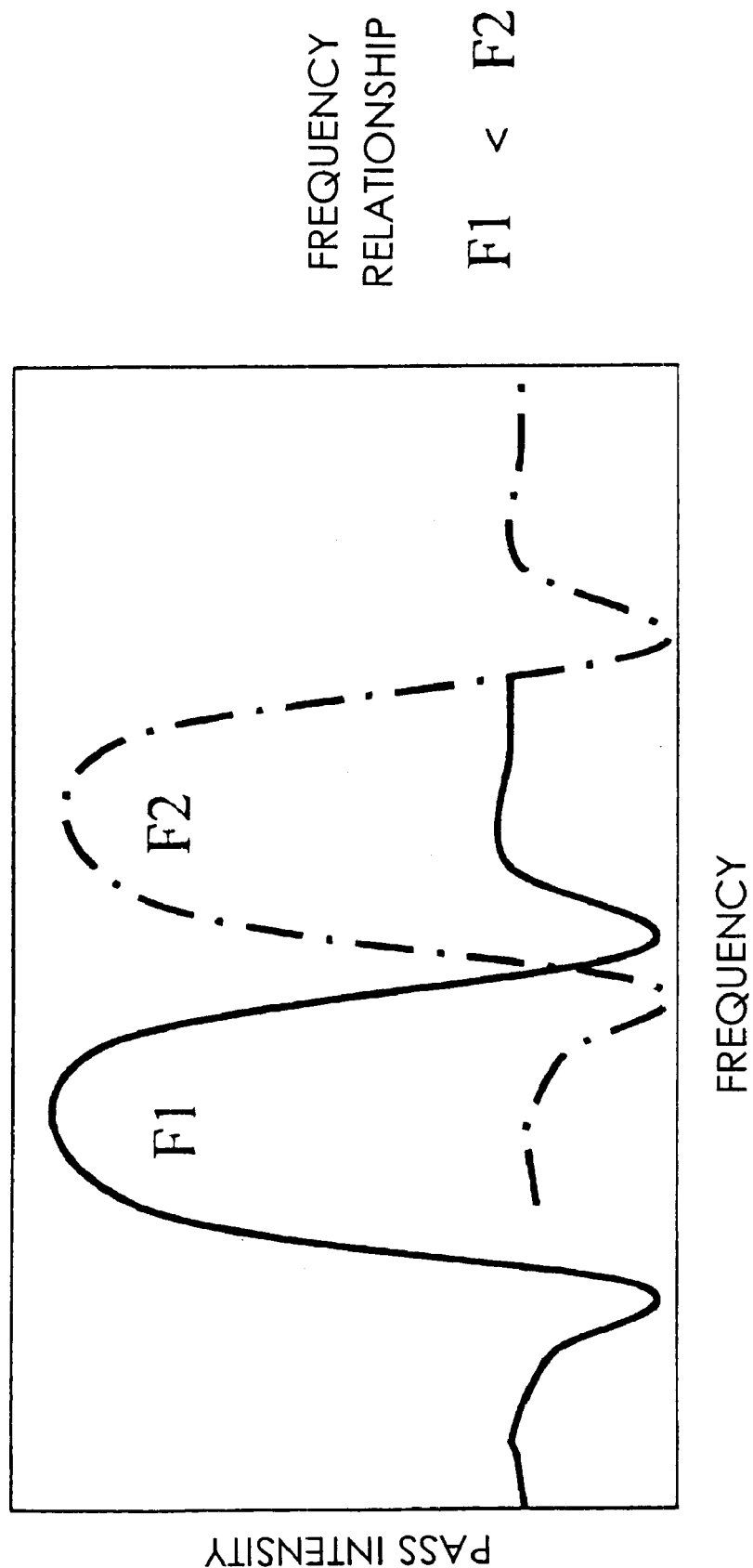
FIG. 2 is a graph showing frequency characteristics of two SAW filters used in a duplexer according to the invention.

FIG. 2 is a graph showing frequency characteristics of the two SAW filters F1 and F2 used in the duplexer of the invention. The SAW filters F1 and F2 have band center frequencies different from each other (F1<F2), and an embodiment can be produced in that the band center frequency of the SAW filter F1 is 836 MHz, and the band center frequency of the SAW filter F2 is 881 MHz.

Figure 3:
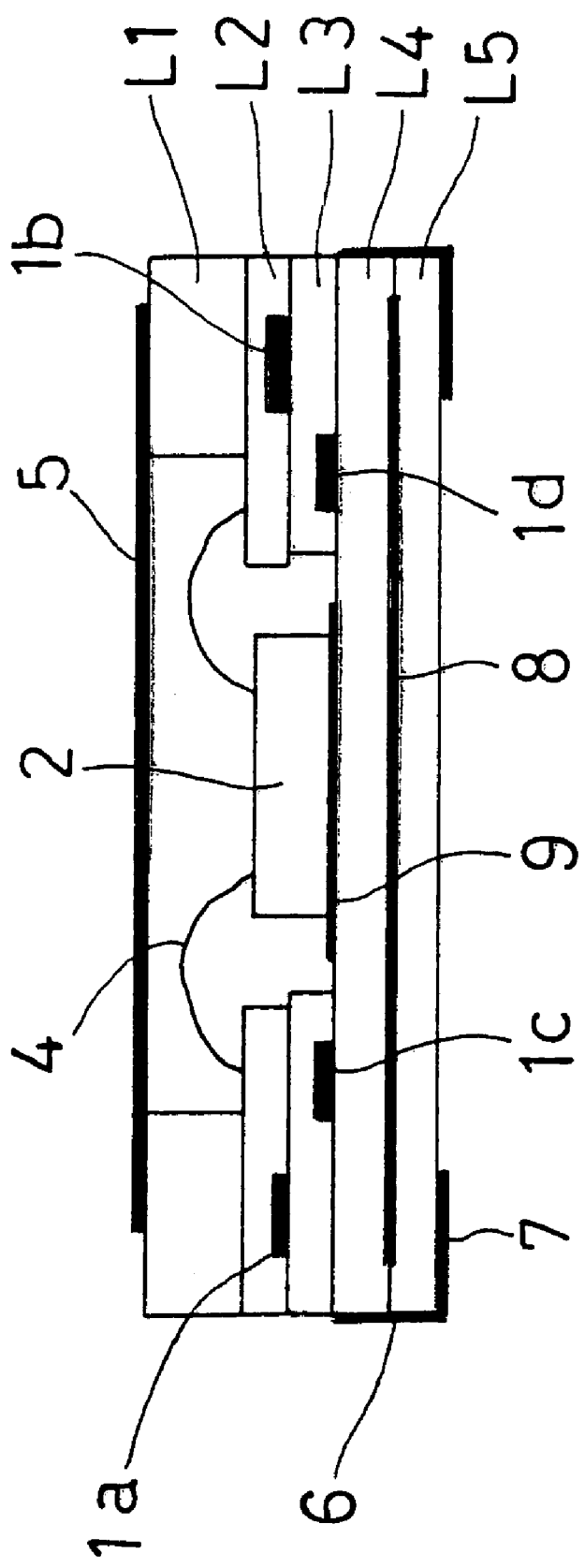
FIG. 3 is a schematic cross sectional view showing an example of a duplexer package mounting a SAW filter according to the invention.
Figure 4:
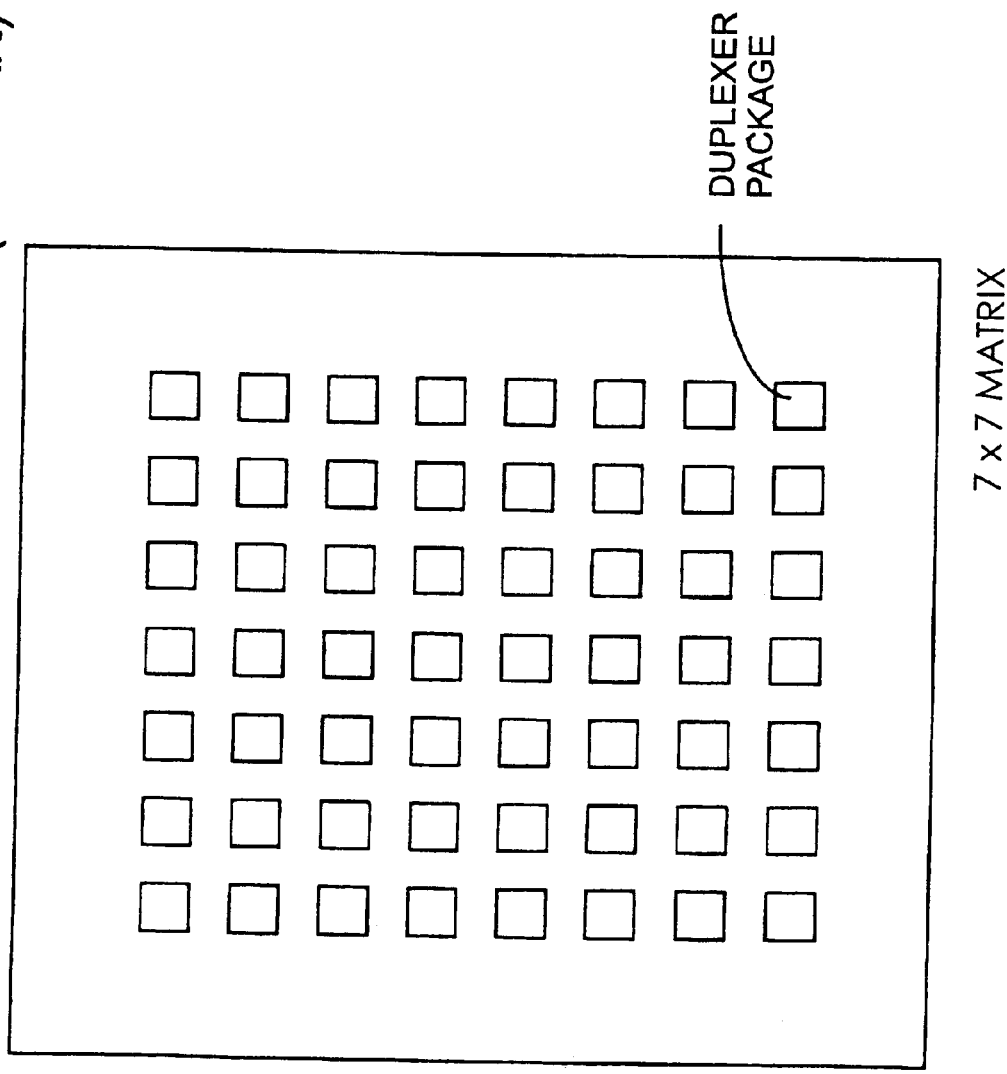
FIG. 4 is a diagram showing a multi-layer sheet of a conventional duplexer package.
Figure 5:
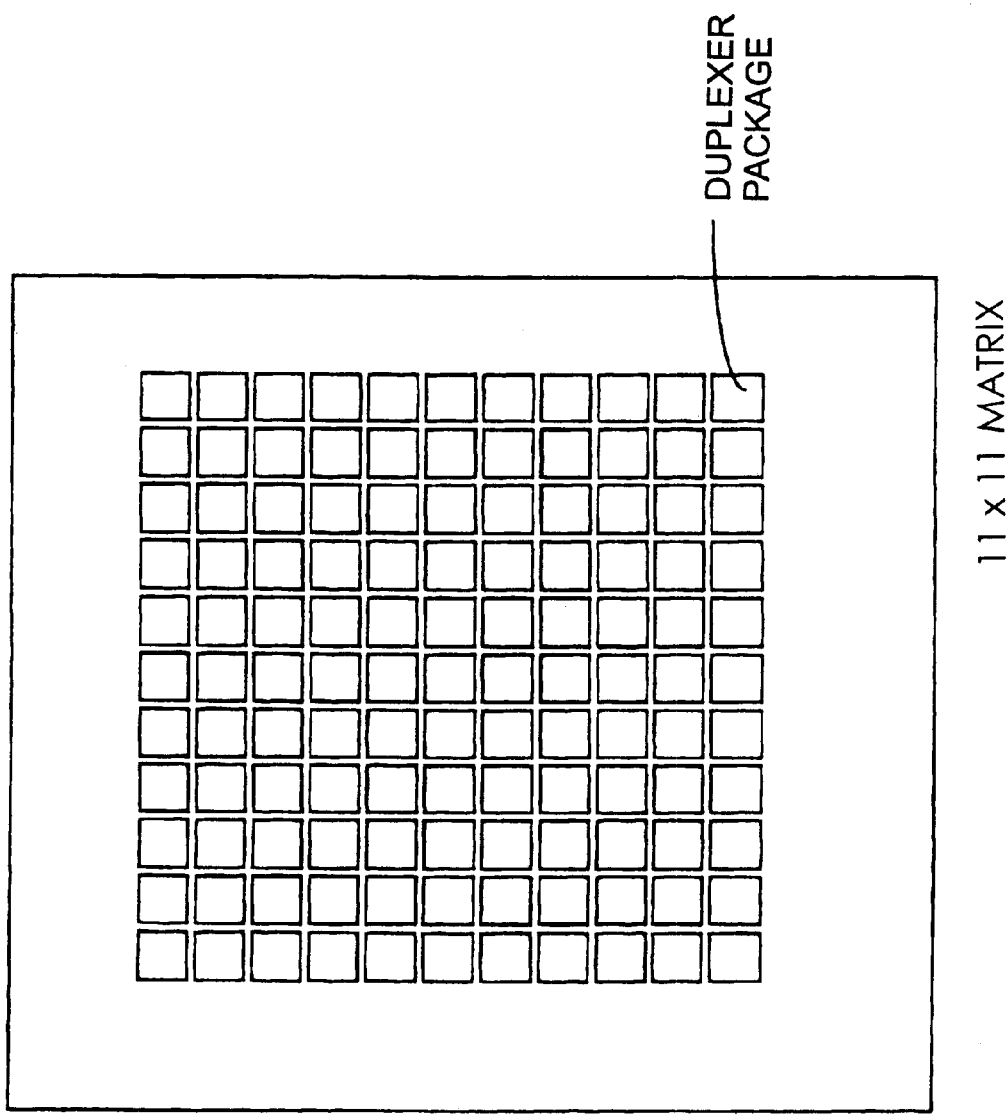
FIG. 5 is a diagram showing a multi-layer sheet of a conventional duplexer package using a fine arrangement.

FIG. 3 is a schematic cross sectional view showing an example of a duplexer package having the SAW filter according to the invention installed therein. In this example, the duplexer package has a multi-layer structure comprising five layers. The number of layers constituting the multi-layer structure is not limited to five and is preferably small from the standpoint of reduction in height.

A lid 5 for protecting the filters inside is arranged on the outermost layer L1 (layer 1). The lid is formed with a metallic material, such as Au plating or Ni plating, or a ceramic material that is the same as the package.

The layer 1 (L1) is a frame of the package for carrying the lid 5 and is formed with a material, such as glass ceramics or alumina ceramics.

The layer 2 (L2) and the layer 3 (L3) are layers called as a cavity layer, and the total height of the layer 2 and the layer 3 is substantially the same as the height of the layer 1.

The surface of the layer 2 (L2) is a layer for forming connection between a terminal on the SAW filter and the outside, and is formed as a so-called bonding terminal layer. The terminals formed on the bonding terminal layer (corresponding to the input output terminals T1 and T2 in FIG. 1) and the terminals on the SAW filters are connected by wires 4.

The layer 2 (L2) is formed with a material, such as glass or alumina ceramics, and the terminals and the wiring pattern on the surface thereof is formed by subjecting a conductive material, such as W, Cu and Ag, to an Au plating treatment. The wire 4 can be formed with a material, such as Al—Si.

The layer 3 (L3) and the layer 4 (L4) are matching layers having a pattern of the matching circuit 1 formed on the surface thereof, and are formed with a material, such as glass or alumina ceramics.

In FIG. 3, the matching circuit 1 is one electrically connected line pattern while it includes parts denoted by 1*a*, 1*b*, 1*c* and 1*d* and is formed over the two layers, i.e., the layer 3 (L3) and the layer 4 (L4).

The parts 1*a* and 1*b* of the matching circuit formed in the layer 3 (L3) are laid down inside the layer to a prescribed pattern shape, and similarly, the parts 1*c* and 1*d* of the matching circuit are laid down inside the layer 4 (L4) to a prescribed pattern shape.

One end of the matching circuit formed in the layer 3 (L3) and one end of the matching circuit formed in the layer 4 (L4) are electrically connected through a via hole (not shown in the figure) penetrating the layer 3 (L3).

The line patterns of the matching circuits of the layer 3 (L3) and the layer 4 (L4) are formed around a void formed at the center for carrying the filter chips.

The layer 4 (L4) is also a layer having the filters F1 and F2 mounted on the surface thereof (i.e., a so-called die attach layer). A GND pattern 9 is formed on the surface of the layer 4 (L4), on which the filters are mounted. The SAW filters are attached to the GND pattern 9 with a conductive paste.

The layer 5 (L5) is the lowermost layer, and a GND pattern 8 for shielding is formed on the surface thereof in contact with the layer 4 (L4).

Outer signal terminals 7(T$_0$, T$_1$ and T$_2$) are formed on the back surface of the layer 5 (L5).

Furthermore, as shown in FIG. 3, a connection line to the outer signal terminals provided on the back surface of the layer 5 (L5) is provided on the side surface of the layers having no bonding terminal and being lower than the layer having the matching circuit patterns, i.e., the layer 3 (L3), the layer 4 (L4) and the layer 5 (L5). The connection line is hereinafter referred to as a side castellation.

When the side castellation is provided only on the three layers, i.e., the layers 3, 4 and 5, positioning of the respective layers of the multi-layer sheet may become more difficult than the case where the side castellation is formed over the four layers, i.e., from the layer 2 to the layer 5, but it becomes possible to reduce the short circuit problem caused by the deviation on accumulating the layers. In other words, the yield upon production can be improved.

The characteristic features of the invention include such a constitution that the respective line patterns of the matching circuit formed over the two layers (the layer 3 and the layer 4) are not arranged to completely overlap each other viewed from the direction perpendicular to the paper surface, i.e., the overlapping direction of the layers.

Figures 12A, 12B:
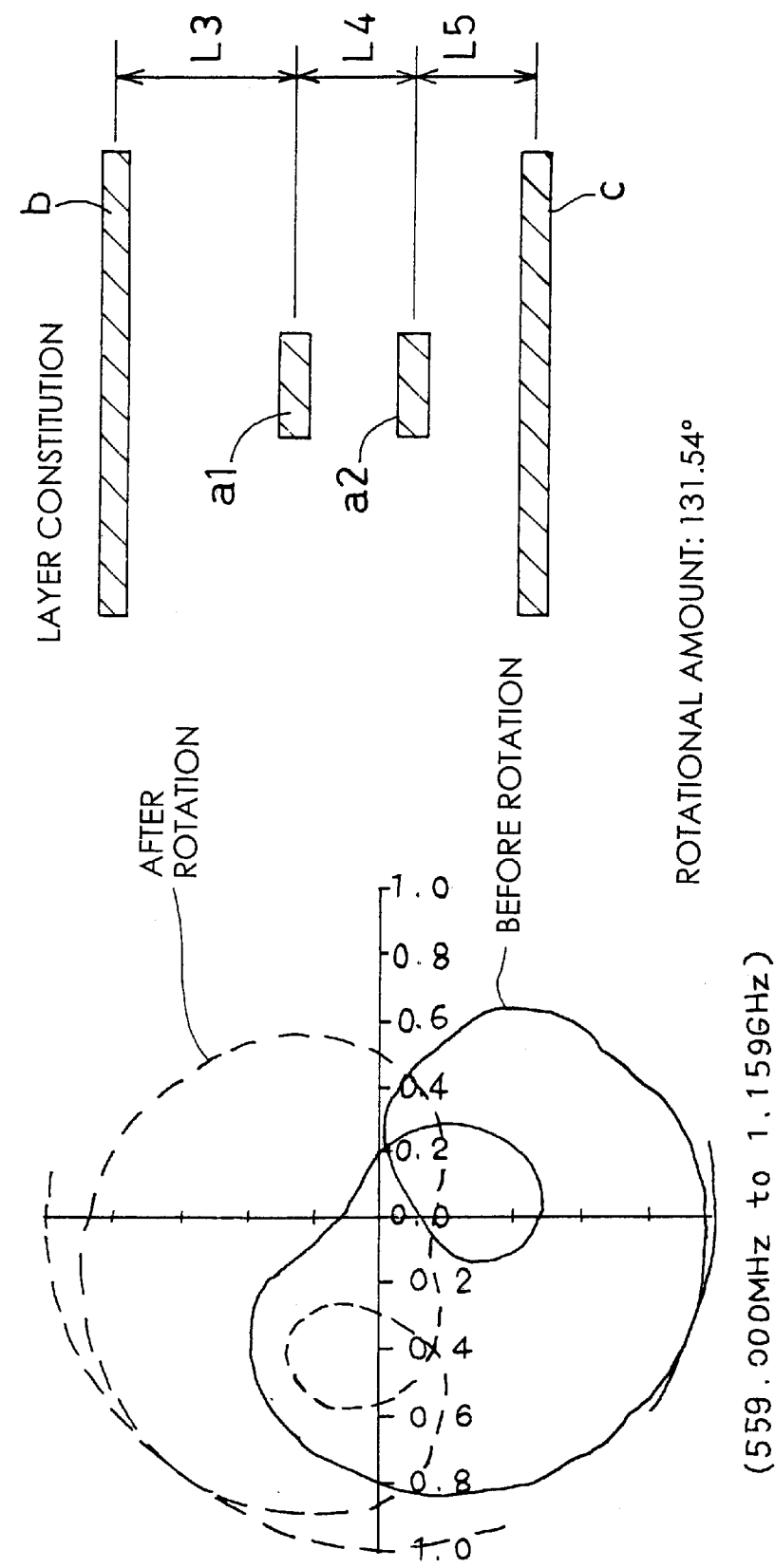
FIGS. 12(a) and 12(b) are diagrams showing a simulation result of a phase rotational amount of a conventional phase matching circuit.

In the case where the two line patterns of the matching circuit overlaps each other in the major part thereof (see FIG. 12), such stable characteristics that described in the foregoing cannot be obtained. The allowable overlapping amount (the area of the overlapped regions) varies depending on the demanded design specification, and thus the overlapping amount cannot be defined, but it is preferred to arrange the two line patterns in such a manner that they do not overlap by about 30% or more. That is, such an arrangement is preferred that the area of the overlapping region is made as small as possible.

For example, in the case where the line patterns of the matching circuit in the respective layers are of a straight pattern, the line patterns of the matching circuit in the respective layers are formed in such an arrangement that the positions of the center lines in the width direction of the respective straight patterns are different by a prescribed distance or more viewed from the direction of accumulating layers. However, it is generally difficult that the arrangements of the line patterns of the matching circuit of the respective layers do not overlap each other in all the positions, and therefore there may be partially overlapped parts and crossed parts.

Furthermore, it is possible that the pattern of the matching circuit of one layer is of a straight pattern, and the pattern of the matching circuit of the other layer is of a snake form pattern. The snake form pattern means at least that it is not a straight pattern, and is sufficiently a curved pattern in total even though it locally contains a straight pattern. For example, the snake form pattern includes a saw tooth wave pattern, a sine wave pattern and a half-wave rectification pattern.

In the case where one is of the straight pattern but the other is of the snake form pattern, there are plural parts where the layers overlap each other viewed from the direction of accumulating the layers, but the layers have the arrangement where they do not overlap in the other parts. Particularly, in the case where the snake form pattern is formed with a symmetric pattern, such as a sine wave pattern, they may be arranged in such a manner that the symmetric center line of the snake form pattern is different from the center line in the width direction of the straight pattern in the direction of accumulating the layers.

Furthermore, both the line patterns of the matching circuit of the two layers, the layer 3 and the layer 4, may be of the snake form pattern. In this case, it is necessary that the two patterns are arranged not to overlap each other, and consideration is necessary upon designing both the patterns, whereby the area of the overlapping region of the two snake form patterns viewed from the direction of accumulating the layers is made as small as possible.

For example, it is possible that the cycles of the curved lines are differentiated, or in alternative, the positions of the layers of the two patterns in the direction of accumulating the layers are deviated by a certain distance.

When the line patterns of the matching circuit formed over the two layers are arranged in the foregoing manner, such stable filter characteristics can be obtained that are closer to the frequency characteristics upon designing the filter. The filter characteristics will be described later.

As described in the foregoing, the duplexer package of the invention has the multi-layer structure comprising five layers, and the outer size thereof can be about 5 mm (width)×5 mm (depth)×1.3 mm (height) in the case of a duplexer for the 800 MHz band.

In the case of a duplexer for the 1.9 GHz band, the outer size can be 3.8 mm (width)×3.8 mm (depth)×1.3 mm (height), and in any case, the size can be about from 10 to 35% of the conventional duplexer.

FIGS. 7(*a*) to 7(*c*) are diagrams showing an example of patterns of the surfaces of the layer 3 (L3) and the layer 4 (L4), in which the matching circuit 1 is formed, among the layers of the duplexer package of the invention.

FIG. 7(*a*) is a plane view of the surface of the layer 4 (L4) viewed from the above, and FIG. 7(*b*) is a plane view of the surface of the layer 3 (L3) viewed from the above.

In FIG. 7(*b*), the rectangular part at the center part is a void. In FIG. 7(*a*), a SAW filter is installed in the rectangular part at the center part.

In FIGS. 7(*a*) and 7(*b*), numeral 11 denotes one line pattern of the matching circuit connected through via holes.

In FIG. 7(b), numeral 1a and 1d denote ends of the matching circuit, and 11b in FIG. 7(b) and 11b' in FIG. 7(a) are connected to each other through a via hole, and 11c' in FIG. 7(a) and 11c in FIG. 7(b) are connected to each other through a via hole.

The line pattern of the layer 4 (L4) in FIG. 7(a) is of a snake form pattern in the elevational direction of the figure, whereas the line pattern of the layer 3 (L3) in FIG. 7(b) is of a straight pattern in the elevational direction of the figure. The ends 11a and 11d of the matching circuit 11 are connected to an antenna via the common terminal T0 and the outer connection terminal T1 provided on the back surface of the layer 5 (L5) through the side castellation of the package.

FIG. 7(c) is a cross sectional view showing the duplexer package of the invention including the patterns of the layer 3 (L3) and the layer 4 (L4) shown in FIGS. 7(a) and 7(b).

FIG. 7(c) shows the state of positions of overlap of the layers of the line patterns of the matching circuit 11, in which the part of the snake form pattern of the layer 4 is arranged outside the straight pattern of the layer 3.

Assuming that the line width of the straight pattern is W (≈0.1 mm), the distance n between the position of the center line of the straight pattern in the width direction and the symmetrical center line of the snake form line is preferably 2.2W or more, i.e., n≧2.2W.

FIGS. 8(a) to 8(f) are plane views showing constitutional patterns of respective layers in one example of a duplexer package of the invention.

Glass ceramics having a high dielectric constant (∈=9.5) is used as a package material of the respective layers, and an multi-layer structure comprising five layers, i.e., from the layer 1 (L1) to the layer 5 (L5), is employed.

FIGS. 8(a) to 8(e) show patterns on the surfaces of the respective layers, i.e., from the layer 1 (L1) to the layer 5 (L5), and FIG. 8(f) shows a pattern on the back surface of the layer 5 (L5).

In the layer 1 (L1) shown in FIG. 8(a), the rectangular part at the center is a void, and a GND pattern is formed around it.

In the layer 2 (L2) shown in FIG. 8(b), pads for wire bonding to the filter F1 and GND terminals are formed, and a pattern for connecting these terminals and terminals on the back surface of the layer 5 (L5) shown in FIG. 8(f) through the side castellation is also formed. The rectangular part at the center is a void.

The side castellation at the layer 2 (L2) is expressed by semicircular cut parts formed on the upper side and the lower side of the outer periphery of the package shown in FIG. 8(b).

In the layer 3 (L3) shown in FIG. 8(c), a matching circuit 12 is formed. One end 12a of the matching circuit 12 is connected to the bonding pad 12d through a via pattern, and 12b is connected to 12b' of the layer 4 (L4) as a lower layer through a via hole. The line width of the line pattern of the matching circuit 12 is about 0.1 mm. The rectangular part at the center is a void.

In the layer 4 (L4) shown in FIG. 8(d), the matching circuit 12 is formed, in which 12b' is the end connected to the pattern of the matching circuit 12 of the layer 3 (L3), and 12c is the other end of the matching circuit 12. The end 12c is connected to the bonding terminal 12e through a via hole.

It is understood from FIGS. 8(c) and 8(d) that the matching circuit 12 is one line pattern having a length over the two layers from one end 12a thereof to the other end 12c thereof.

The rectangle at the center of the layer 4 (L4) is a GND pattern, and a SAW filter is installed on the rectangular part.

FIG. 8(e) shows the surface pattern of the layer 5 (L5), in which a GND pattern is formed substantially over the entire surface thereof. The GND pattern is connected to the GND terminal of the layer 2 (L2) through the side castellation on the upper side and the lower side of the periphery of the package.

A side castellation for connecting the patterns on the surface and the back surface of the layer 5 (L5) is formed on the left side and the right side of the periphery of the package. The side castellation formed on the right side in FIG. 8(e) is connected to the GND pattern.

FIG. 8(f) shows the back surface pattern of the layer 5 (L5), in which the terminals (including the GND, the common terminal T0 and the outer input and output terminals T1 and T2) for connecting to elements outside the duplexer package are arranged.

In FIGS. 8(a) to 8(e), numerals 13a to 13e at the left lower part of the package denote a via hole for positioning the five layers. The via hole is an independent pattern that is not connected to the duplexer pattern. When the positioning is normally achieved, 13a in the layer 1 to 13e in the layer 5 are electrically connected to each other.

In an accumulation step of accumulating the layer 1 (L1) to the layer 5 (L5) at a prescribed position, the via hole is formed before baking the package, and the connection of the via hole is confirmed by an inspection tool. When the connection from the layer 1 to the layer 5 cannot be confirmed, the positional deviation occurs, and compensation of the deviation can be conducted before baking.

The compensation of the positions of the layers can be conducted, for example, by inserting a miniature pin into the via hole. Because the positional deviation can be compensated in the accumulation step before baking, the yield of the duplexer package can be improved.

While the case where the matching circuit is formed over two layers is described in the foregoing example, it may be formed over three or more layers.

The filter characteristics of the case where a duplexer is fabricated by using the duplexer package will be described below. The characteristics of an antenna duplexer having filter chips installed at the center part thereof will be considered herein.

Figure 10:
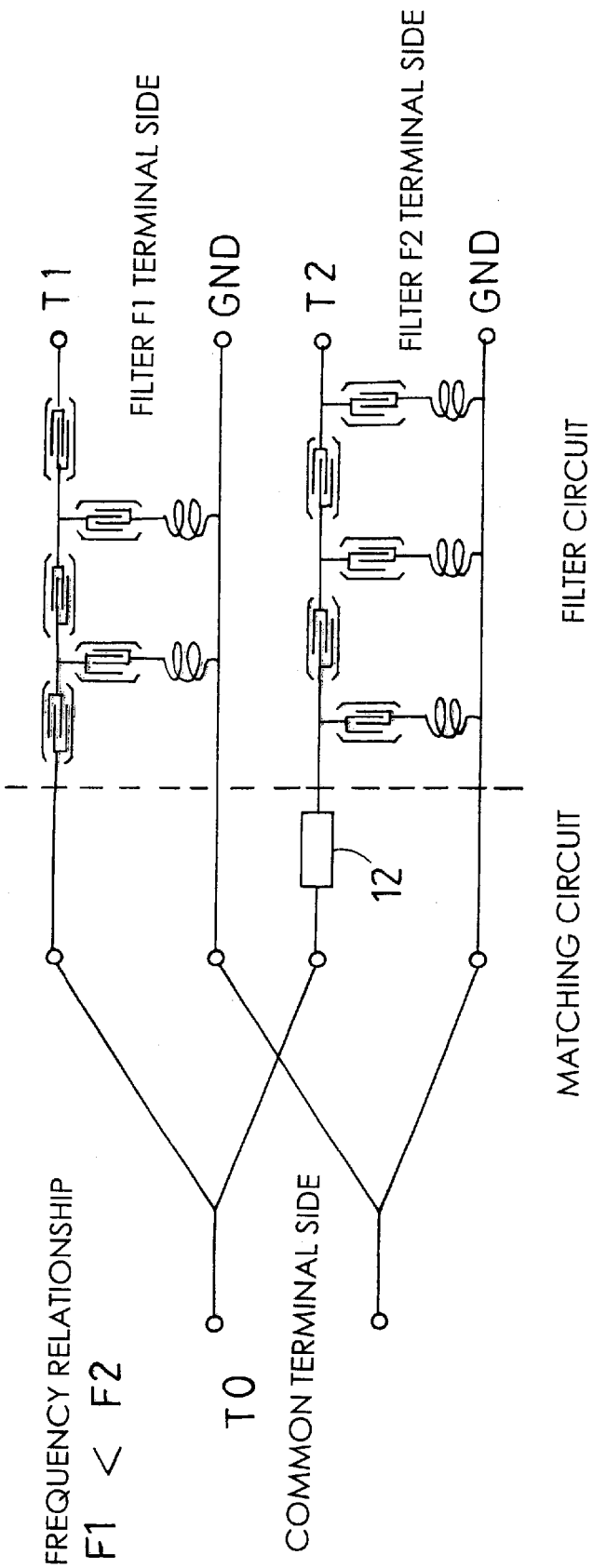
FIG. 10 is a schematic circuit pattern showing a duplexer using ladder type SAW filters according to the invention.

As the filter chips installed, a so-called ladder type SAW filter comprising 1-port surface acoustic wave resonators connected in a ladder form. FIG. 10 is a schematic circuit pattern showing the duplexer using the ladder type SAW filters F1 and F2.

The SAW filter comprising $LiTaO_3$ (azimuth: 42° Y-cut X-propagation) as a substrate material and an alloy mainly comprising aluminum (such as Al—Cu and Al—Mg) or a multi-layer film thereof (one of Al—Cu/Cu/Al—Cu, Al/Cu/Al, Al/Mg/Al and Al—Mg/Mg/Al—Mg) is used as an electrode material.

The filter chips are installed on the layer 4 (L4) of the package shown in FIG. 8(d), and the terminals of the layer 2 (L2) and the prescribed terminals on the filter chips are connected with Al—Si wires.

In the case where a duplexer for a 1.9 GHz band is produced, the electrode period of the SAW resonator is about from 1.95 to 2.18 μm, and the normalized film thickness is about 9%.

The line length of the phase matching circuit 12 is about 10 mm and is of a straight pattern and a snake form pattern as shown in FIGS. 8(c) and 8(d). In the SAW filter for the PCS system, the band width of the transmission and reception filter is 60 MHz, the loss is about 2.0 dB for the transmission filter and about 4.0 dB for the reception filter, and the stop band attenuation amount is about 30 dB for the transmission filter and about 40 dB for the reception filter.

In the case where a duplexer for an 880 MHz band is produced, the electrode period of the SAW resonator is about from 4.3 to 4.8 μm, and the normalized film thickness is about 9%.

The line length of the phase matching circuit 12 is about 24 mm and is of a straight pattern and a snake form pattern as shown in FIGS. 8(c) and 8(d).

In the SAW filter for the AMPS system, the band width of the transmission and reception filter is 25 MHz, the loss is about 1.2 dB for the transmission filter and about 3.0 dB for the reception filter, and the stop band attenuation amount is about 40 dB for the transmission filter and about 50 dB for the reception filter.

FIG. 9 is a diagram showing deviation of the line patterns of the phase matching circuit in the invention.

FIG. 9 is a cross sectional view of a part of the duplexer package, in which the line width of the line pattern 21 formed on the surface of the layer 3 is w1, and the line width of the line pattern 22 formed on the surface of the layer 4 is w2.

The parts on the left side and the right side of both the line patterns 21 and 22 (i.e., parts expressed by 23, 24, 25 and 26) show bleeding amounts of the line patterns formed after baking the package. The symbol w0 denotes the distance between both the patterns taking the bleeding amounts (24 and 25) into consideration. The bleeding amounts are about 0.1w1 for the line pattern 21 and about 0.1w2 for the line pattern 22.

An example of w1=w2=0.1 mm, and w0=1.2×w1+0.1w=1.3w=0.13 mm is produced herein.

While the duplexer having the matching circuit formed over the two layers as shown in FIGS. 8(a) to 8(f) is described in this example, simulation is conducted for comparing the characteristics where the matching circuit is formed in one layer or is formed over two or three layers.

Figure 15:
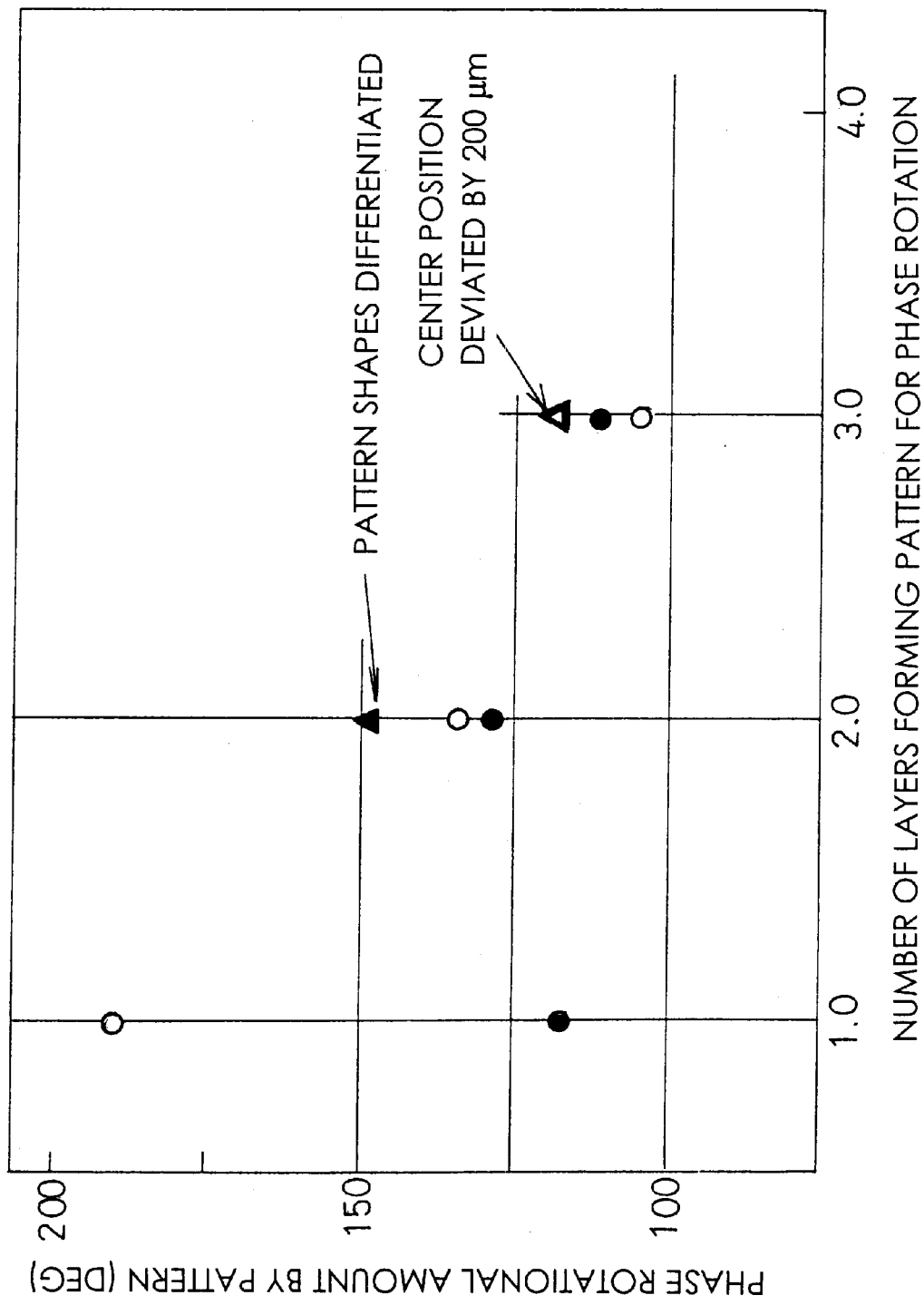
FIG. 15 is a graph showing the relationship between the number of layers, over which a matching circuit is formed, and the phase rotational amount.

FIG. 15 is a graph showing the relationship between the number of layers, over which the matching circuit is formed, and the phase rotational amount.

The phase rotational amount herein means an amount in terms of angle (deg) of rotation showing the extent of improvement of matching by inserting the matching circuit on a Smith chart.

Because the preferred rotational angle varies depending on parameters, such as a center frequency of the objective filter, the extent of improvement cannot be discussed only with the amount of the rotational angle, but in FIG. 15, the larger the rotational amount, the better the characteristics of the matching are, and the smaller the smaller the rotational amount, the poorer the characteristics of the matching are.

In FIG. 15, the white circles show the theoretical values of the case where the matching circuit is of a straight pattern, and the black circles show the measured values where the duplexer is fabricated. In the case where the matching circuit is formed over two layers, both the patterns are of a straight pattern, and the center positions in the width direction thereof are the same as each other. In the case where the matching circuit is formed in one layer, the rotational amount where the duplexer is fabricated is decreased from 180° to 130°, and it is understood that the matching becomes considerably poor.

In the case where the matching circuit is formed over two layers, the matching becomes slightly poor, but is slightly improved in the case where the matching circuit is formed over three layers.

The black triangle where the matching circuit is formed over two layers in FIG. 15 shows the case where the shapes of the two line patterns are of a straight shape and a snake form pattern, and it is understood that the matching is further improved in comparison to the case where both the line patterns are of a straight shape since the rotational amount is increased to about 150°.

Taking the foregoing discussions into consideration, it is understood that the characteristics of the duplexer is improved in the case where the line pattern of the matching circuit is formed over two layers with different pattern shapes rather than the case where it is formed in one layer.

The white triangle where the matching circuit is formed over three layers in FIG. 15 shows the case where the center position of the center line pattern among the three line patterns is deviated from the center position of the other line patterns by 200 μm.

Figure 14:
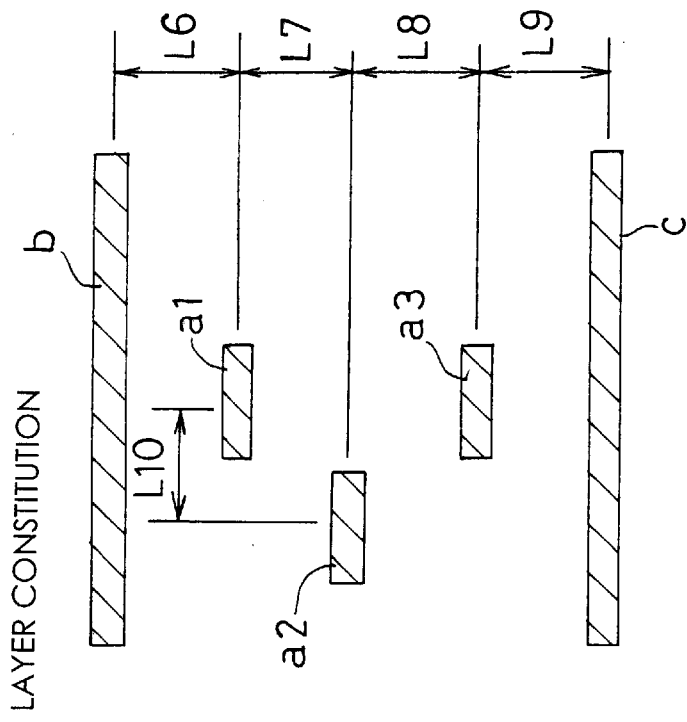
FIGS. 14(a) and 14(b) are diagrams showing a simulation result of a phase rotational amount where a matching circuit of the invention is formed over three layers.
Figure 14:
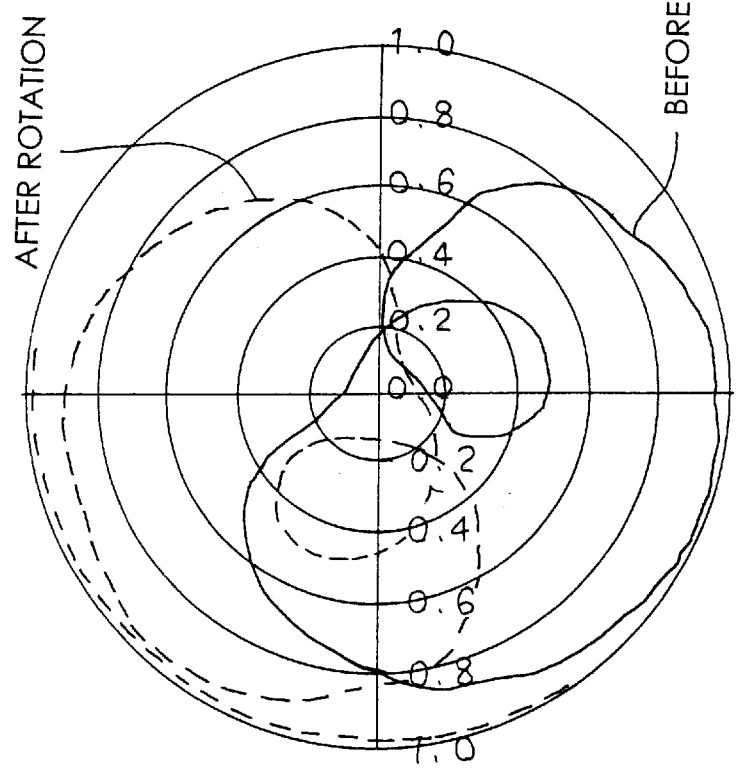

FIG. 14 is a diagram showing a simulation result of the phase rotational amount where the line patterns of the matching circuit are formed over three layers, and the center position of the center line pattern is deviated. The symbol L10 in FIG. 14 denotes the deviated amount of the line pattern, and L10=200 μm.

The phase rotational amount in the case where the three line patterns are aligned is about 105° as shown in FIG. 13, whereas the phase rotational amount in the case where the center line pattern is deviated is about 121° as shown in FIG. 14. When the positional deviated amount L10 is 100 μm, the phase rotational amount is about 111°.

In the case where the matching circuit is formed over three layers, the matching is improved in the case where the center position is deviated since the rotational amount is slightly increased rather than the case where the center positions are aligned.

Figure 16:
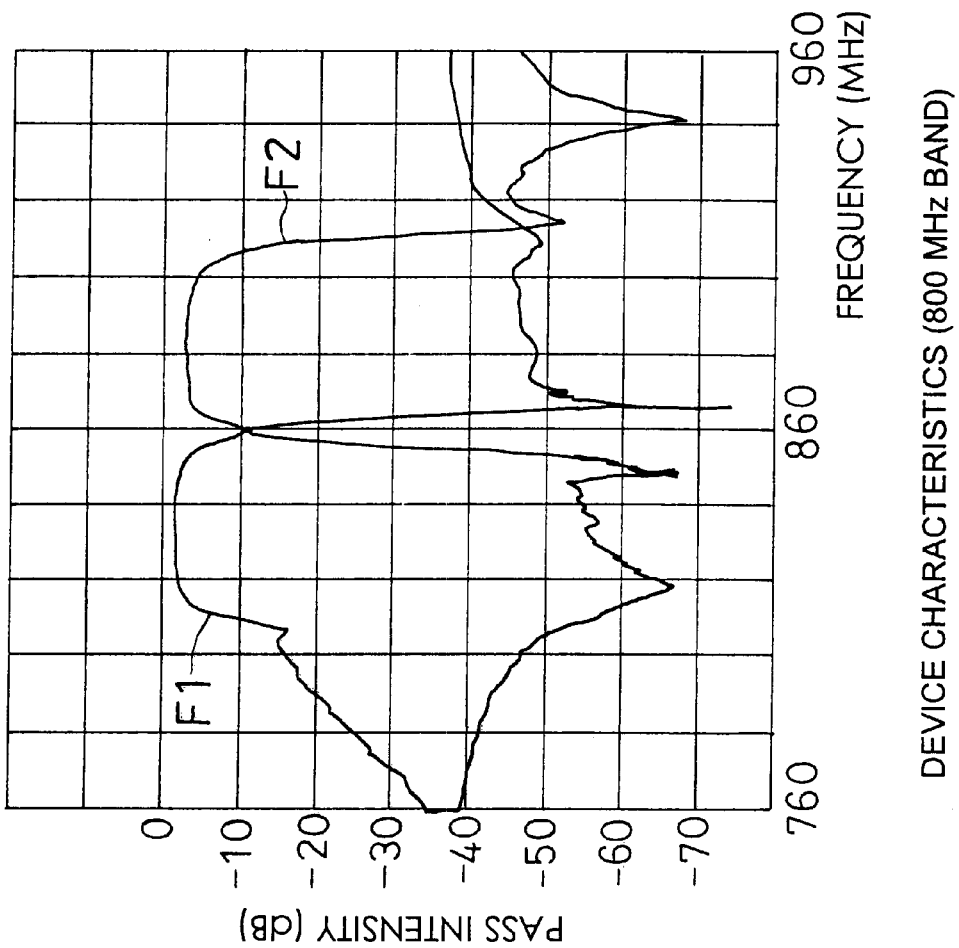
FIGS. 16(a) and 16(b) are a Smith chart and a graph of device frequency characteristics of the case where a matching circuit of the invention is formed over two layers.
Figure 16:
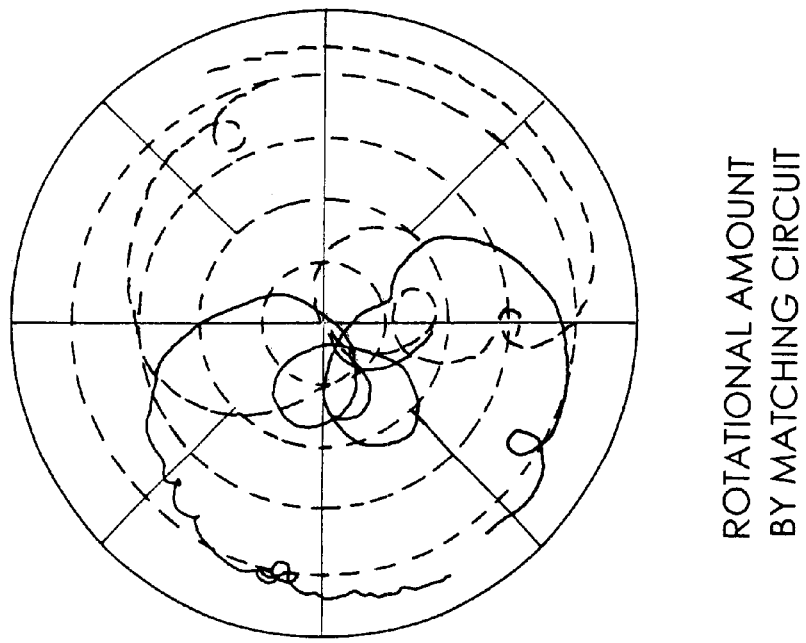
Figure 17:
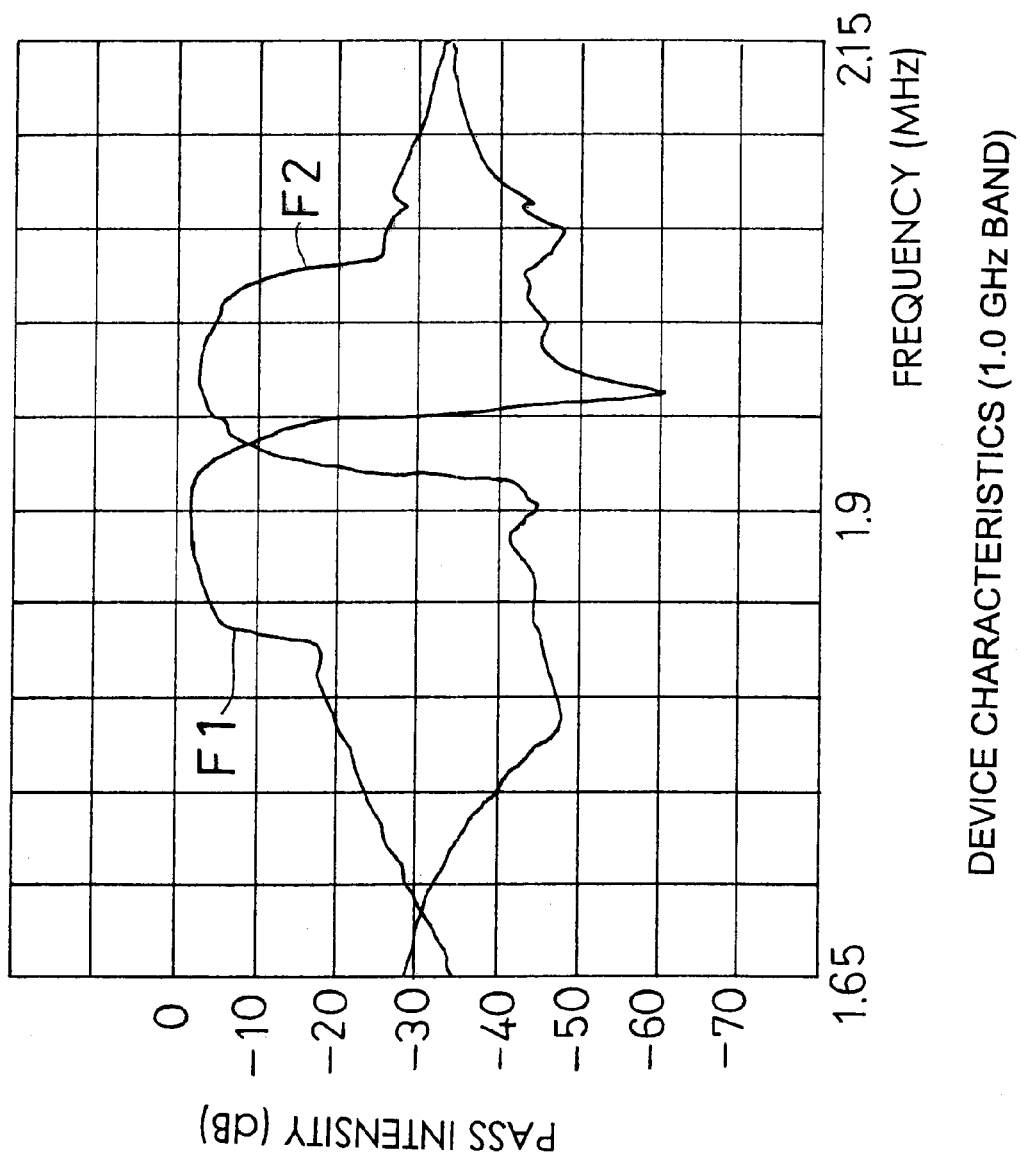
FIG. 17 is a graph showing device frequency characteristics in the case where a matching circuit of the invention is formed over two layers.

FIGS. 16(a), 16(b) and 17 show a Smith chart and graphs showing the device frequency characteristics of the duplexer package of the invention shown in FIGS. 7(a) to 7(c). The matching circuit is formed over the two layers, i.e., the layer 3 and the layer 4, and one of the line patterns is of a straight shape and the other thereof is of a snake form pattern.

In FIG. 16(a), the phase rotational amount is about 220°.

FIG. 16(b) shows the filter characteristics (device frequency characteristics) of a duplexer for an 800 MHz band, and FIG. 17 shows the filter characteristics of a duplexer for a 1.9 GHz band. In both the graphs shown in FIG. 16(b) and FIG. 17, improvement can be found in the point where the attenuation amount in the pass band of the counter filter is increased in comparison to FIG. 19(b).

Figure 18:
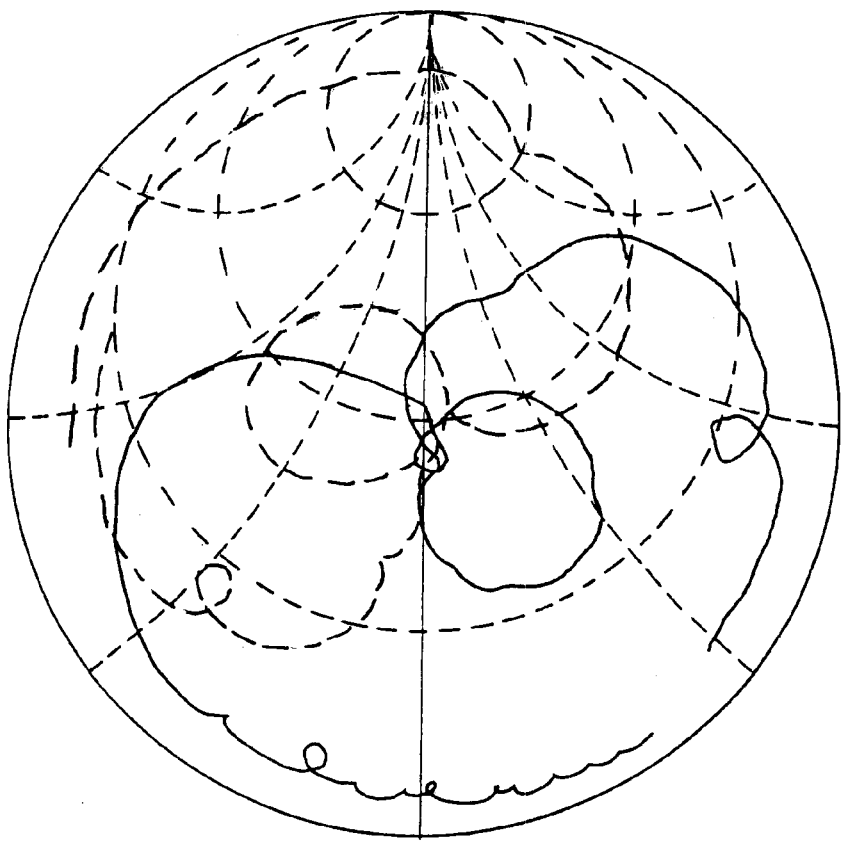
FIG. 18 is a Smith chart showing the conventional case where a matching circuit is formed in one layer.
Figure 20:
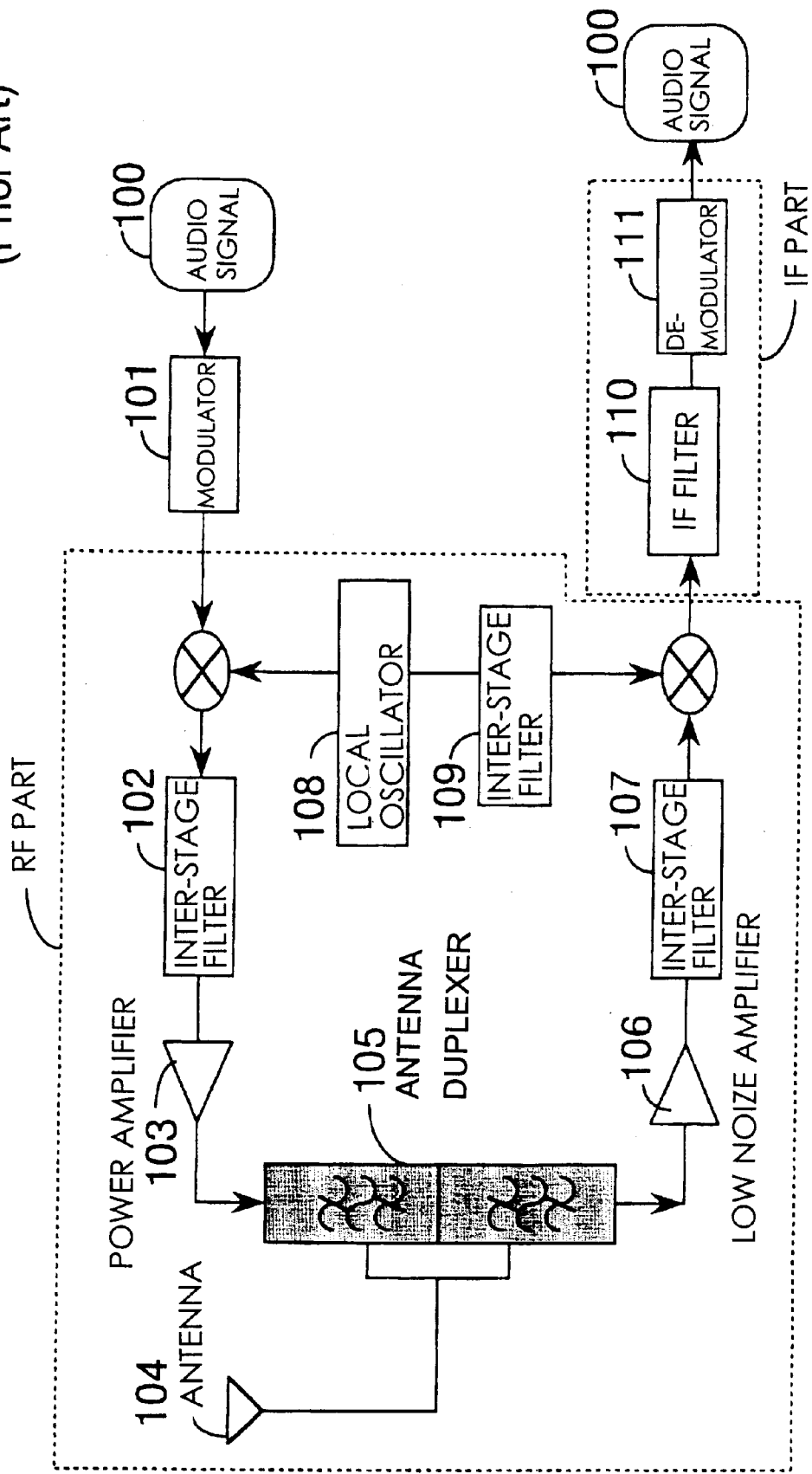
FIG. 20 is a constitutional block diagram showing a radio frequency part of a portable phone that has been conventionally used.

FIG. 18 is a Smith chart showing the conventional case where a matching circuit is formed in one layer. The phase rotational amount in this case is about 180°, which indicates that the matching is poor since the rotational amount is smaller than FIG. 16(a) by about 40°.

FIGS. 19(a) and 19(b) are a Smith chart and a graph of device frequency characteristics (800 MHz band) of the case where the matching circuit is formed over two layers, and the center positions in the width direction thereof are the same as each other, i.e., the line patterns are arranged to overlap in the layer direction.

In the Smith chart of FIG. 19(a), the phase rotational amount is about 140°, which is smaller than FIG. 16(a) by 80°.

It is understood from the comparison between the device frequency characteristics in FIG. 19(b) and FIG. 16(b) that the attenuation amount in the pass band of the counter filter is improved in FIG. 16(b).

It is understood from the comparison among FIGS. 16(a) through 19(b) that stable characteristics can be obtained by a duplexer package having a matching circuit formed over two layers with the positions of the two line patterns being differentiated from each other as shown in FIGS. 7(a) to 7(c), rather than a duplexer package having a matching circuit formed in one layer, and a duplexer package having a matching circuit formed over two layers with the positions of the two line patterns overlapping each other in the direction of accumulating the layers.

The line length of the matching circuit. is necessarily about 24 mm in a duplexer for an 800 MHz band, which requires a size of a duplexer package of about 7×5×1.3 mm in the case where the matching circuit is formed in one layer, whereas the size can be about 5×5×1.3 mm in the case where the matching circuit is formed over two layers as in FIGS. 8(a) to 8(f). That is, the size of the duplexer package can be decreased.

A side castellation of the conventional duplexer package is formed on the periphery of the respective layers from the layer 2 (L2) to the layer 5 (L5), but in the duplexer package of the invention, a side castellation having no relationship to the pattern of the wire bonding layer {layer 2) is formed on the layer 5, which is the lower layer than the layers (layer 3 and layer 4) having the line patterns of the matching circuit.

That is, because there is no side castellation on the layers having the line patterns of the matching circuit, the margins of shape and position of the line parterres of the layer 3 and the layer 4 can be made large, and the short circuit problem upon accumulation can also be reduced.

Furthermore, because the via hole (13a to 13e) of a pattern independent from the other patterns is provided as shown in FIGS. 8(a) to 8(f), the presence or absence of positional deviation can be easily confirmed after accumulating all the layers but before baking, and in the case where the positional deviation is found, compensation of the positions can be conducted before baking, whereby the yield can be improved.

According to the invention, a duplexer package can be provided that has a small size and stable filter characteristics.

What is claimed is:

1. A duplexer device comprising two surface acoustic wave filters having different band center frequencies and one phase matching circuit for matching phases of the two surface acoustic wave filters, wherein the phase matching circuit is formed of line patterns, at least one of the line patterns is formed as divided among a plurality of internal layers of a multi-layer package, and at least the line patterns formed on the internal layers adjacent to each other have pattern shapes different from each other.

2. A duplexer device as claimed in claim 1, wherein the pattern shape of the phase matching circuit formed on one of the adjacent internal layers is a straight pattern, and the pattern shape of the phase matching circuit formed on the other of the adjacent internal layers is a snake form pattern.

3. A duplexer device comprising two surface acoustic wave filters having different band center frequencies and one phase matching circuit for matching phases of the two surface acoustic wave filters, wherein the phase matching circuit is formed of line patterns, at least one of the line patterns is formed as divided among a plurality of internal layers of a multi-layer package, at least the line patterns formed on the internal layers adjacent to each other have pattern shapes different from each other, the pattern shape of the phase matching circuit formed on one of the adjacent internal layers is a straight pattern, and the pattern shape of the phase matching circuit formed on the other of the adjacent internal layers is a snake form pattern, and wherein a symmetric center line of the snake form pattern and a center line in a width direction of the straight pattern are different from each other in an overlapping direction of the internal layers.

4. A duplexer device comprising two surface acoustic wave filters having different band center frequencies and one phase matching circuit for matching phases of the two surface acoustic wave filters, wherein the phase matching circuit is formed of line patterns, at least one of the line patterns is formed as divided among a plurality of internal layers of a multi-layer package, at least the line patterns formed on the internal layers adjacent to each other have pattern shapes different from each other, and wherein the pattern shapes of the phase matching circuits formed on the adjacent internal layers are a straight line pattern, and positions of the straight patterns are different from each other in an overlapping direction of the internal layers.

5. A duplexer device comprising two surface acoustic wave filters having different band center frequencies and a phase matching circuit for matching phases of the two surface acoustic wave filters, wherein the phase matching circuit is formed of one or more line patterns, at least one of the line patterns is formed as divided among a plurality of internal layers of a multi-layer package, at least the line patterns formed on the internal layers adjacent to each other have pattern shapes different from each other, and wherein the pattern shapes of the phase matching circuits formed on the adjacent internal layers are a snake form pattern, and positions of the snake form patterns are different from each other in an overlapping direction of the internal layers.

6. A duplexer device as claimed in any one of claims 1 to 5, wherein a first circuit pattern formed on a surface of the uppermost layer of the plurality of internal layers and a second circuit pattern formed on an upper side of the lowermost layer of the plurality of internal layers are connected through a via hole that is not connected to any other circuit patterns, the via hole piercing and electrically connecting all layers to each other for positioning.

7. A duplexer device as claimed in one of claims 1 to 5, further comprises a bonding layer having a bonding terminal for connecting to the surface acoustic wave filters and provided above the layer on which the phase matching circuit has been formed, and an lowermost layer having an outer connection terminal, wherein the bonding terminal and the outer connection terminal are connected through an outer side surface of the internal layers positioned between the bonding layer and the lowermost layer.

8. A duplexer device as claimed in any one of claims 1 to 5, further comprises a lowermost layer having an outer connection terminal, wherein a connection line for connecting to the outer connection terminal is provided on an outer side surface of a layer under the layers on which the phase matching circuit have been formed.

* * * * *